（12） United States Patent
Kanai et al.

(10) Patent No.: US 8,026,771 B2
(45) Date of Patent: Sep. 27, 2011

(54) DRIVER DEVICE, PHYSICAL QUANTITY MEASURING DEVICE, AND ELECTRONIC INSTRUMENT

(75) Inventors: Masahiro Kanai, Suwa (JP); Naoki Yoshida, Suwa (JP); Eitaro Otsuka, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 974 days.

(21) Appl. No.: 11/984,984

(22) Filed: Nov. 26, 2007

(65) Prior Publication Data

US 2011/0121907 A1 May 26, 2011

(30) Foreign Application Priority Data

Nov. 27, 2006 (JP) ................ 2006-318760
Mar. 19, 2007 (JP) ................ 2007-069932
Nov. 20, 2007 (JP) ................ 2007-300256

(51) Int. Cl.
*G01P 15/10* (2006.01)
*H03B 5/06* (2006.01)
*H03B 5/30* (2006.01)
*H03B 5/32* (2006.01)
*H03B 5/36* (2006.01)

(52) U.S. Cl. .......... 331/173; 331/65; 331/158; 331/172; 73/514.29

(58) Field of Classification Search ............ 331/65, 331/116 R, 116 FE, 116 M, 154, 158, 159, 331/163, 172, 173, 182, 183; 73/1.38, 1.82, 73/1.83, 32 A, 54.41, 64.53, 514.29, 702, 73/862.59
See application file for complete search history.

(56) References Cited

U.S. PATENT DOCUMENTS

2004/0182184 A1 9/2004 Yokoi et al.
2011/0037527 A1* 2/2011 Shrivastava et al. .......... 331/158

FOREIGN PATENT DOCUMENTS

JP A 2004-286503 10/2004

OTHER PUBLICATIONS

Masahiro Kanai et al., New U.S. Patent Application filed Nov. 26, 2007.

* cited by examiner

*Primary Examiner* — David Mis
(74) *Attorney, Agent, or Firm* — Oliff & Berridge, PLC

(57) ABSTRACT

A driver device that forms an oscillation loop with a vibrator and causes the vibrator to produce driving vibrations includes a current-voltage converter that converts a current that flows through the vibrator into a voltage, an output circuit that causes the vibrator to produce the driving vibrations based on a signal that is converted into a voltage with respect to a given voltage, and a high-pass filter that is provided in the oscillation loop between the current-voltage converter and the output circuit. The driver device causes the vibrator to produce the driving vibrations while changing a reference potential of the high-pass filter, and then causes the vibrator to produce the driving vibrations while fixing the reference potential.

22 Claims, 15 Drawing Sheets

DRIVER DEVICE, PHYSICAL QUANTITY MEASURING DEVICE, AND ELECTRONIC INSTRUMENT

Japanese Patent Application No. 2006-318760 filed on Nov. 27, 2006, Japanese Patent Application No. 2007-69932 filed on Mar. 19, 2007, and Japanese Patent Application No. 2007-300256 filed on Nov. 20, 2007, are hereby incorporated by reference in their entirety.

BACKGROUND OF THE INVENTION

The present invention relates to a driver device which causes a vibrator to produce driving vibrations, a physical quantity measuring device (e.g. vibrating gyroscope) using the driver device, an electronic instrument, and the like.

Gyroscopes are classified as a rotating gyroscope, a vibrating gyroscope, and the like depending on the method of detecting the force applied to an object. In particular, a vibrating gyroscope is considered to be advantageous for reducing size and cost from the viewpoint of the constituent elements and the like. As a vibrating gyrosensor which detects an angular velocity applied to an object, a piezoelectric vibrating gyrosensor is known which excites a crystal or a piezoelectric element that is advantageous for increasing reliability and reducing size. A piezoelectric vibrating gyrosensor utilizes a phenomenon in which a Coriolis force occurs perpendicularly to vibrations when an angular velocity is applied to a vibrating object.

For example, a vibrating gyrosensor which detects an angular velocity causes a physical quantity transducer (vibrator) to produce driving vibrations in a specific direction. When an angular velocity is applied to the vibrator, a Coriolis force occurs perpendicularly to driving vibrations to produce detection vibrations. Since the detection vibrations occur perpendicularly to the driving vibrations, a detection signal (signal component due to detection vibrations) differs in phase from a drive signal (signal component due to driving vibrations) by 90 degrees. The detection signal can be synchronously detected separately from the drive signal utilizing the above phenomenon, for example.

A vibrating gyrosensor is used in a wide variety of applications, such as shake detection for a video camera or a digital camera, positioning using the global positioning system (GPS) for a car navigation system, and aircraft or robot position detection.

A vibrating gyrosensor used in these applications is driven by a battery. Therefore, it is necessary to increase the life of the battery by reducing the power consumption of the vibrating gyrosensor as much as possible. In this case, it is preferable to stop supplying power to the vibrating gyrosensor when an angular velocity or the like is not detected and to supply power to the vibrating gyrosensor from the battery only when using the vibrating gyrosensor. This makes it necessary to cause the vibrating gyrosensor to perform a normal operation within a short period of time after activation.

It is important to cause a vibrating gyrosensor to reliably start an operation which implements steady oscillations by causing current to flow through an oscillation loop during oscillation startup. Specifically, the vibrating gyrosensor does not necessarily start the operation which implements steady oscillations even if an oscillation driver circuit is activated by supplying power to the oscillation driver circuit. There may be a case where current does not flow through the oscillation loop even after supplying power, whereby steady oscillations do not occur even after a certain period of time. The reliability of a physical quantity measuring device is increased by preventing such a situation (i.e., oscillation failure).

JP-A-2004-286503 discloses technology which reduces the startup time of a vibrating gyrosensor, for example. JP-A-2004-286503 discloses technology in which a CR oscillation circuit or a ring oscillator is provided in an oscillation loop so that the oscillation amplitude is increased by an amplifier immediately after activation.

A vibrating gyrosensor driver device must cause a vibrator to constantly vibrate (oscillate) at its resonance frequency in order to stably detect the angular velocity applied to the vibrator. The driver device also must cause the vibrator to oscillate and start a normal operation within a short time. Moreover, it is preferable to form the driver device using a small circuit with low power consumption in order to increase the life of a battery at low cost.

On the other hand, when forming the vibrator using a crystal with a high Q value and hermetically sealing the vibrator in a package, the driving Q value of the vibrator increases to a large extent. Therefore, the period of time (i.e., startup time) until a signal from the vibrator becomes stable increases when causing the vibrator to produce driving vibrations.

According to the technology disclosed in JP-A-2004-286503, when causing the crystal vibrator to oscillate at a frequency close to its driving frequency, the areas of a capacitor and a resistor of the CR oscillation circuit must be increased. This results in an increase in size and cost of a vibrating gyroscope (vibrating gyrosensor). According to the technology disclosed in JP-A-2004-286503, it is difficult to cause the crystal vibrator with a high Q value to operate at its driving frequency because the crystal vibrator is driven at another frequency during startup. Therefore, the period of time until stable oscillations occurs increases when affected by manufacturing variations and the like.

According to the technology disclosed in JP-A-2004-286503, signal energy from the CR oscillation circuit or the like is injected into the vibrator irrespective of whether or not the vibrator oscillates. In this case, since energy is injected at a given frequency regardless of the resonance frequency of the vibrator, the signal from the CR oscillation circuit hinders steady oscillations when the vibrator produces steady oscillations. Therefore, in order to reduce the startup time required for the vibrator to produce steady oscillations, it is necessary to inject energy into the oscillation loop so that the oscillations of the vibrator are not hindered due to an oscillation condition which differs to a large extent from the steady oscillation condition of the oscillation loop including the vibrator.

SUMMARY

According to one aspect of the invention, there is provide a driver device that forms an oscillation loop with a vibrator and causes the vibrator to produce driving vibrations, the driver device comprising:

a current-voltage converter that converts a current that flows through the vibrator into a voltage;

an output circuit that causes the vibrator to produce the driving vibrations; and a high-pass filter that is provided in the oscillation loop between the current-voltage converter and the output circuit, the driver device causing the vibrator to produce the driving vibrations while changing a reference potential of the high-pass filter, and then causing the vibrator to produce the driving vibrations while fixing the reference potential.

According to another aspect of the invention, there is provided a physical quantity measuring device that measures a physical quantity corresponding to a detection signal output from a vibrator based on driving vibrations produced by the vibrator and the physical quantity to be measured, the physical quantity measuring device comprising:

the vibrator;

the driver device as defined in claim 1 that causes the vibrator to produce the driving vibrations; and a detection device that detects an output signal corresponding to the physical quantity based on the detection signal, the detection device including a synchronous detector that synchronously detects the detection signal based on an output from a comparator, the comparator generating a synchronous detection reference signal based on a signal in the oscillation loop.

According to another aspect of the invention, there is provided an electronic instrument comprising the above physical quantity measuring device.

DETAILED DESCRIPTION OF THE EMBODIMENT

Figure 1:
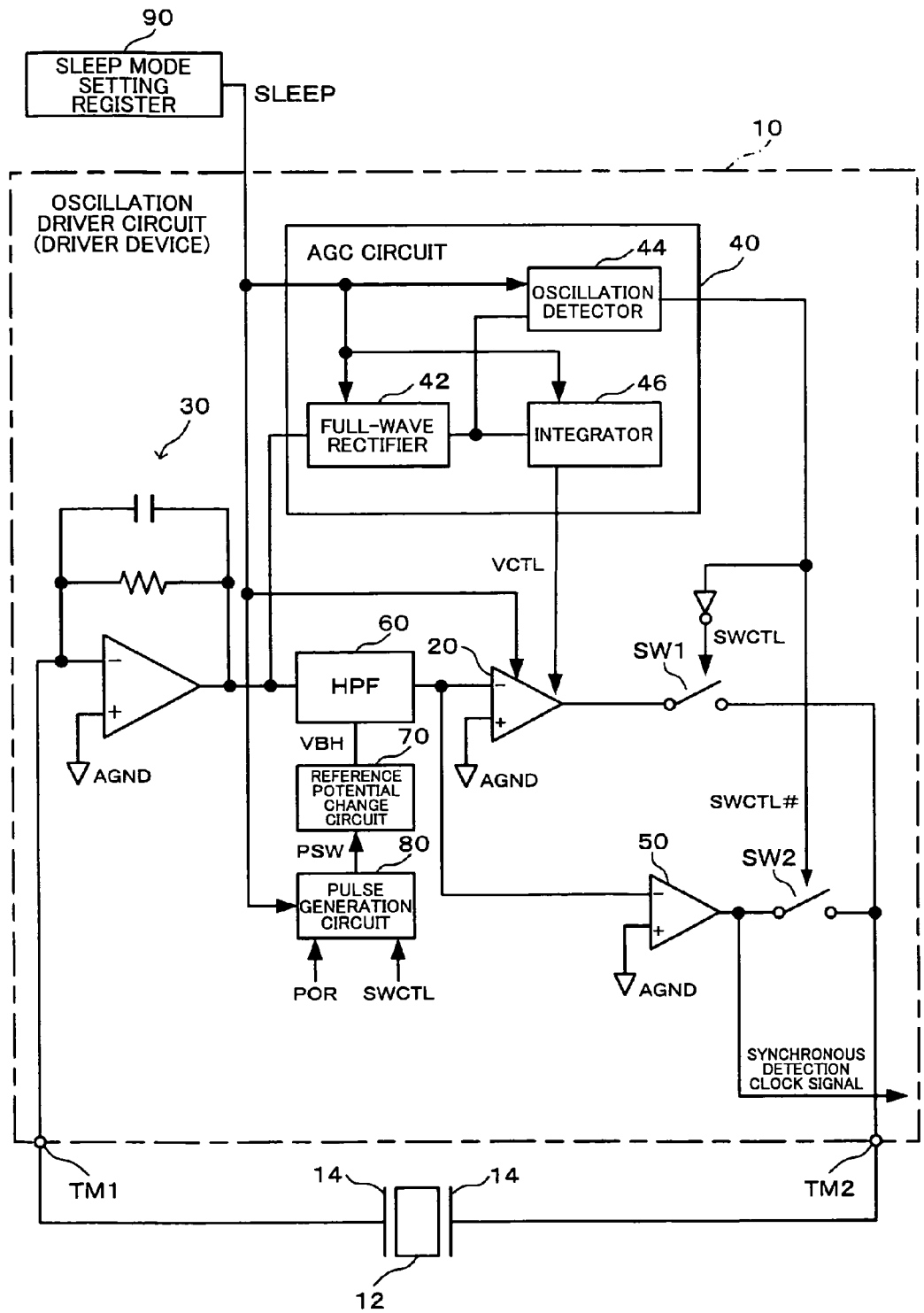
FIG. 1 is a circuit block diagram showing a configuration example of an oscillation driver circuit according to one embodiment of the invention.

Aspects of the invention may reliably cause oscillations in an oscillation loop to start while minimizing hindrance to oscillations of a vibrator, for example. Aspects of the invention may also reduce the oscillation startup time, for example.

(1) According to one embodiment of the invention, there is provided a driver device that forms an oscillation loop with a vibrator and causes the vibrator to produce driving vibrations, the driver device comprising:

a current-voltage converter that converts a current that flows through the vibrator into a voltage;

an output circuit that causes the vibrator to produce the driving vibrations; and a high-pass filter that is provided in the oscillation loop between the current-voltage converter and the output circuit, the driver device causing the vibrator to produce the driving vibrations while changing a reference potential of the high-pass filter, and then causing the vibrator to produce the driving vibrations while fixing the reference potential.

(2) In the driver device according to this embodiment, the output circuit may be a comparator that causes the vibrator to produce the driving vibrations based on a signal that is converted into a voltage with respect to a given voltage.

(3) In the driver device according to this embodiment, the output circuit may be a gain control amplifier that causes the vibrator to produce the driving vibrations while controlling an oscillation amplitude in the oscillation loop.

According to any of the embodiments (1) to (3), the high-pass filter is used which can function as a phase adjustment means in the oscillation loop. Energy is injected into the vibrator during oscillation startup by changing the reference potential of the high-pass filter, whereby oscillations of the vibrator reliably occur and the oscillation startup time of the vibrator can be reduced. This enables the vibrator to reliably start oscillations at high speed even if the output circuit (e.g., comparator or gain control amplifier) has an input offset voltage.

Moreover, since the reference potential of the high-pass filter which changes is modulated to the resonance frequency of the vibrator during oscillation startup, the oscillation condition does not differ to a large extent from the steady oscillation condition in the oscillation loop. Therefore, energy can be injected into the oscillation loop without hindering the oscillations of the vibrator, whereby oscillation startup can be efficiently achieved.

(4) In the driver device according to this embodiment, the driver device may include a comparator that generates a synchronous detection reference signal based on a signal in the oscillation loop, the driver device may cause the vibrator to produce the driving vibrations in the oscillation loop including the current-voltage converter, the high-pass filter, the comparator, and the vibrator during oscillation startup when the reference potential of the high-pass filter is changed; and the driver device may cause the vibrator to produce the driving vibrations in the oscillation loop including the current-voltage converter, the high-pass filter, the gain control amplifier, and the vibrator in a steady oscillation state.

In the oscillation loop, the vibrator generally allows only a resonance frequency component contained in white noise in the oscillation loop to pass through. As a result, only a resonance frequency signal component is amplified, whereby the vibrator 12 starts to oscillate. Specifically, a general oscillation circuit amplifies only a resonance frequency component of the vibrator contained in intrinsic noise (particularly white noise) in the oscillation loop to cause the vibrator to oscillate. However, intrinsic noise changes to a large extent due to changes in temperature conditions, power supply conditions, and process conditions. Therefore, the period of time until a steady oscillation state occurs after oscillation startup also changes to a large extent due to changes in temperature conditions, power supply conditions, and process conditions. According to this embodiment, the vibrator can be reliably caused to oscillate by changing the reference potential of the high-pass filter irrespective of changes in temperature conditions, power supply conditions, and process conditions. Moreover, the period of time until a steady oscillation state is achieved after oscillation startup can be reliably reduced.

(5) In the driver device according to this embodiment, when the driver device is set in a first operation mode to perform a normal operation, the driver device may cause the vibrator to produce the driving vibrations while changing the reference potential, and then may cause the vibrator to produce the driving vibrations while fixing the reference potential; and when the driver device is set in a second operation mode to perform a sleep operation, the driver device may cause the vibrator to produce the driving vibrations in the oscillation loop including the current-voltage converter, the high-pass filter, the comparator, and the vibrator.

According to this embodiment, the first and second operation modes are provided The oscillation loop is switched when the driver device is set in the first operation mode. When the driver device is set in the second operation mode, it is unnecessary to operate the circuit section which controls oscillations in the first operation mode. Therefore, power consumption in the second operation mode can be reduced while accelerating oscillation startup when the second operation mode has been canceled.

(6) In the driver device according to this embodiment, the driver device may include a gain control circuit that controls a gain of the gain control amplifier based on a current that flows through the vibrator in the oscillation loop, when the driver device is set in the second operation mode, the driver device may disable the operations of the gain control amplifier and the gain control circuit without disabling the operation of the comparator.

According to this embodiment, when the driver device is set in the first operation mode, oscillation startup is accelerated during oscillation startup by changing the reference potential of the high-pass filter, and the gain control amplifier controls the oscillation amplitude in the oscillation loop when a steady oscillation state has been achieved. This accelerates the synchronous detection process and oscillation startup. When the driver device is set in the second operation mode, the oscillation state is maintained in the oscillation loop while the operations of the gain control amplifier and the gain control circuit are suspended. Therefore, power consumption in the second operation mode can be reduced while accelerating oscillation startup when the second operation mode has been canceled.

(7) In the driver device according to this embodiment, the driver device may change the reference potential of the high-pass filter only in a given period that starts based on a switch timing from the second operation mode to the first operation mode.

According to this embodiment, energy is also injected into the vibrator when the second operation mode is switched to the first operation mode by changing the reference potential of the high-pass filter, whereby the oscillation startup time of the vibrator can be reduced. In this case, since the reference potential of the high-pass filter has been modulated to the resonance frequency of the vibrator, the oscillation condition does not differ to a large extent from the steady oscillation condition of the oscillation loop. Therefore, energy can be injected into the oscillation loop without hindering the oscillations of the vibrator, whereby oscillation startup can be efficiently achieved.

(8) In the driver device according to this embodiment, the polarity of an output from the gain control amplifier with respect to a given potential may be the same as the polarity of an output from the comparator with respect to the given potential.

According to this embodiment, it is unnecessary to provide a circuit which reverses polarity, whereby an increase in circuit scale can be suppressed.

(9) In the driver device according to this embodiment, the driver device may include:

a reference potential change circuit that supplies one voltage level selected from a plurality of voltage levels to the high-pass filter as the reference potential; and a pulse generation circuit that generates a switch pulse that is used to select the voltage level output as the reference potential, the pulse generation circuit may output the switch pulse only in a given period.

According to this embodiment, the reference potential of the high-pass filter can be changed using a simple configuration.

(10) In the driver device according to this embodiment, a start timing of the given period may be a power-on reset start timing of the driver device.

(11) In the driver device according to this embodiment, a finish timing of the given period may be a timing when it has been detected that a signal in the oscillation loop has exceeded a given threshold value level or a timing when a given number has been counted based on a start timing of the given period.

According to the embodiment (10) or (11), since the circuit necessary for controlling the oscillation amplitude in the oscillation loop can be utilized in order to specify the start timing or the finish timing of the given period in which the reference potential of the high-pass filter is changed, or a circuit that detects the level in the oscillation loop can be omitted, an increase in circuit scale can be suppressed. In particular, the convenience to the user can be increased by specifying the start timing of the given period in which a signal necessary for a modulation circuit is generated. Moreover, since the length of the given period can be specified by counting a given reference clock signal based on the start timing, a circuit that detects the oscillation amplitude can be omitted, whereby the circuit scale can be reduced, for example.

(12) In the driver device according to this embodiment, the pulse generation circuit may include:

a power-on reset circuit that generates a power-on reset signal; and a switch pulse generation circuit that generates one or more pulses in a given period based on the power-on reset signal;

the switch pulse generation circuit may include a plurality of delay units, each of the plurality of delay units generating a pulse based on an input signal, and the switch pulse generation circuit may output a logical OR result of the pulses generated by the plurality of delay units; and the pulse generation circuit may output the switch pulse in a period from a change timing of the power-on reset signal to a change timing of a detection result signal that indicates that a signal in the oscillation loop has exceeded a given threshold value level.

According to this embodiment, the configuration of the circuit that changes the reference potential of the high-pass filter can be simplified.

(13) In the driver device according to this embodiment, an amplitude of a change in the reference potential in a reference potential change period may be greater than an amplitude of an input offset voltage of the output circuit.

According to this embodiment, oscillation startup can be reliably accelerated.

(14) In the driver device according to this embodiment, the high-pass filter may include:

a capacitor element that is inserted between an output of the current-voltage converter and an input of the output circuit; and a resistor element, the reference potential being supplied to one end of the resistor element, and the input of the output circuit being connected to the other end of the resistor element.

(15) In the driver device according to this embodiment, when the capacitance of the capacitor element is referred to as C, the resistance of the resistor element is referred to as R, and the amplitude of a change in the reference potential is referred to as $\Delta V$, an input offset voltage Vx of the output circuit may be smaller than $\Delta V/((1+(\omega \times C \times R)^2)^{1/2}$.

According to the embodiment (14) or (15), oscillation startup can be reliably accelerated while simplifying the circuit configuration.

(16) In the driver device according to this embodiment, when the reference potential in a steady oscillation state is referred to as V0, the reference potential may be a potential that is alternately switched between a voltage V4 that is higher in potential than the voltage V0 and a voltage V3 that is lower in potential than the voltage V0 in a reference potential change period.

(17) In the driver device according to this embodiment, when the reference potential in a steady oscillation state is referred to as V0, the reference potential may be a potential that is alternately switched between the voltage V0 and a voltage V4 that is higher in potential than the voltage V0.

(18) In the driver device according to this embodiment, when the reference potential in a steady oscillation state is referred to as V0, the reference potential may be a potential that is alternately switched between the voltage V0 and a voltage V3 that is lower in potential than the voltage V0.

According to the embodiment (17) or (18), the configuration of the circuit that changes the reference potential of the high-pass filter can be simplified. Moreover, the oscillation state can be promptly stabilized in a steady oscillation state subsequent to oscillation startup.

(19) In the driver device according to this embodiment, the vibrator may be a capacitive-coupling vibrator; and the output circuit may cause the vibrator to produce the driving vibrations by applying a rectangular-wave drive signal to the vibrator.

The rectangular-wave drive method has an advantage in that the variation in the drive signal is small. Moreover, since the voltage amplitude is easily controlled, the circuit configuration can be simplified, whereby the circuit scale can be reduced. When using the capacitive-coupling vibrator (vibrator in which a direct-current blocking capacitor lies in the signal path in the internal equivalent circuit), an arbitrary potential may be used as the direct-current potential of the oscillation loop, whereby the degree of freedom relating to the circuit configuration is increased. A piezoelectric element can be given as an example of the capacitive-coupling vibrator (capacitive vibrator).

(20) According to another embodiment of the invention, there is provided a physical quantity measuring device that measures a physical quantity corresponding to a detection signal output from a vibrator based on driving vibrations produced by the vibrator and the physical quantity to be measured, the physical quantity measuring device comprising:

the vibrator;

the driver device as defined in claim 1 that causes the vibrator to produce the driving vibrations; and a detection device that detects an output signal corresponding to the physical quantity based on the detection signal, the detection device including a synchronous detector that synchronously detects the detection signal based on an output from a comparator, the comparator generating a synchronous detection reference signal based on a signal in the oscillation loop.

According to this embodiment, a physical quantity measuring device can be provided which prevents breakage of a vibrator without increasing the circuit scale and reduces size and power consumption by applying a driver device which can reduce the oscillation startup time by efficiently performing oscillation startup while minimizing hindrance to oscillations of the vibrator.

(21) In the physical quantity measuring device according to this embodiment, the detection device may include a phase shifter that adjusts phases of an output from the comparator and the detection signal.

According to this embodiment, the phase can be adjusted corresponding to a change in phase during a weak detection signal detection process. As a result, a highly accurate phase adjustment can be achieved while preventing an increase in circuit scale.

(22) According to another embodiment of the invention, there is provided an electronic instrument comprising one of the above physical quantity measuring devices.

This embodiment contributes to reducing the size and the power consumption of an electronic instrument which performs a given process using the physical quantity measurement results. According to this embodiment, an electronic instrument can be provided which includes a driver device which can prevent breakage of a vibrator and reduce the oscillation startup time without increasing the circuit scale.

Embodiments of the invention are described in detail below with reference to the drawings. Note that the embodiments described below do not in any way limit the scope of the invention laid out in the claims. Note that all elements of the embodiments described below should not necessarily be taken as essential requirements for the invention.

First Embodiment

1. Driver Device

FIG. 1 is a block diagram showing a configuration example of an oscillation driver circuit (driver device) according to this embodiment. The oscillation driver circuit (driver device) according to this embodiment is used to measure a physical quantity using an output signal obtained by synchronously detecting a detection signal output from a vibrator based on driving vibrations produced by the vibrator and the physical quantity to be measured.

An oscillation driver circuit 10 includes first and second connection terminals TM1 and TM2 (electrodes or pads). A vibrator 12 is inserted between the first and second connection terminals outside the oscillation driver circuit 10. An excitation means 14 is attached to the vibrator 12. The excitation means 14 is connected to the oscillation driver circuit 10 to form an oscillation loop. An oscillation starts in a state in which the gain of a driver provided in the oscillation driver circuit 10 is large (i.e., larger than unity). In this state, only noise is input to the driver. The noise contains wave motions at a wide range of frequencies including the natural resonance frequency of the desired driving vibrations. The noise is input to the vibrator 12.

The vibrator 12 is formed of a piezoelectric single crystal as described later, for example. A signal containing a large amount of wave motions at the desired natural resonance frequency is output due to the frequency filtering effect of the vibrator 12, and is input to the driver. The above operation is repeated in the oscillation loop so that the percentage of the signal at the desired natural resonance frequency increases, whereby the amplitude of the signal input to the driver increases.

In a steady oscillation state, the output current from the vibrator 12 is converted into a voltage value using a current-voltage converter 30. The oscillation amplitude in the oscillation loop is controlled using an auto gain control (AGC) circuit (gain control circuit in a broad sense) 40 based on the voltage value, for example. Specifically, the current-voltage converter 30 converts the current flowing through the vibrator into voltage. The AGC circuit 40 controls the oscillation amplitude in the oscillation loop based on the current flowing through the vibrator in the oscillation loop. This causes the gain (loop gain) while the signal goes around the oscillation loop to become unity, whereby the vibrator 12 stably oscillates.

It is indispensable to cause the vibrator to stably oscillate when measuring the physical quantity. Specifically, if the amplitude of the drive signal produced by the vibrator is not constant, the output signal from the vibrator does not become constant, whereby the physical quantity cannot be accurately measured.

It is also indispensable to accelerate the oscillation startup of the vibrator in order to reduce the power consumption of the system including the vibrator and the oscillation driver circuit. Specifically, oscillations can be produced only when required by promptly obtaining stable oscillations, whereby an operation period in which power is unnecessarily consumed can be reduced.

In this embodiment, a gain control amplifier (hereinafter abbreviated as "GCA") 20 or a comparator 50 is provided in the oscillation driver circuit 10 as the driver. The gain control amplifier 20 or the comparator 50 functions as an output circuit which drives the vibrator 12.

The gain of the GCA 20 is controlled by the AGC circuit 40. The GCA 20 may also function as a comparator. In the oscillation loop including the vibrator 12, energy is injected into the vibrator 12 during oscillation startup in the oscillation loop including the comparator 50, and the vibrator 12 is caused to continue to oscillate in a steady oscillation state in the oscillation loop including the GCA 20.

In this embodiment, the oscillation driver circuit 10 includes the comparator 50 provided in parallel with the GCA 20. The oscillation driver circuit 10 includes a first switching element SW1 inserted between the output of the GCA 20 and the second connection terminal TM2. The first switching element SW1 is ON/OFF-controlled using a switch control signal SWCTL. The oscillation driver circuit 10 includes a second switching element SW2 inserted between the output of the comparator 50 and the second connection terminal TM2. The second switching element SW2 is ON/OFF-controlled using a switch control signal SWCTL#. The switch control signal SWCTL# is an inversion signal of the switch control signal SWCTL. The oscillation driver circuit 10 outputs the output from the comparator 50 as a synchronous detection clock signal (synchronous detection reference signal).

In the oscillation loop including the current-voltage converter 30, the comparator (GCA 20 or comparator 50), and the vibrator 12, a 180-degree phase shift ideally occurs due to the current-voltage converter 30 and the comparator, respectively. In the actual situation, the phase shift delays by several degrees due to manufacturing variations and the like. Therefore, it is desirable to provide a forward phase shift means in the oscillation loop. In this embodiment, a high-pass filter (hereinafter abbreviated as "HPF") 60 is provided in the oscillation loop between the output of the current-voltage converter 30 and the input of the comparator.

The output from the GCA 20 or the output from the comparator 50 may be used to reduce the oscillation startup time. In this case, the output level of the GCA 20 may not change due to an input offset voltage of the GCA 20, or the output level of the comparator 50 may not change due to an input offset voltage of the comparator 50.

This point is described below with reference to FIG. 20.

Figure 20:
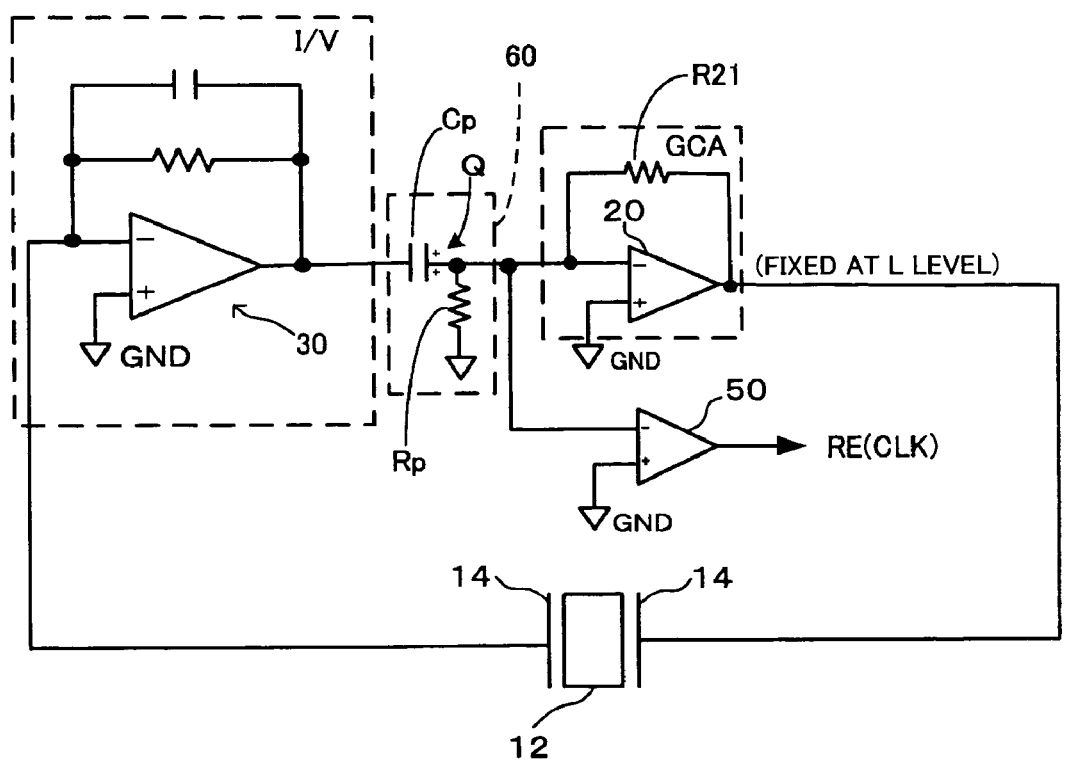
FIG. 20 is a view illustrative of an example of the cause of an oscillation failure.

FIG. 20 is a view illustrative of an example of the cause of an oscillation failure. During oscillation startup, it is important to cause the driver circuit to reliably start the operation which implements steady oscillations by causing current to flow through the oscillation loop. However, the driver circuit (oscillation driver circuit) 10 may not necessarily start the above operation even when activating the driver circuit 10 by supplying power. There may be a case where current does not flow through the oscillation loop even after supplying power, whereby steady oscillations do not occur even after a certain period of time.

FIG. 20 shows an example of the cause of such a problem. In FIG. 20, the high-pass filter 60 formed of a capacitor Cp and a resistor Rp is provided between the current-voltage converter (I/V) 30 and the gain control amplifier (GCA) 20. For example, when a charge Q has been stored in the capacitor Cp for some reason when power is supplied so that a non-inverting terminal of the gain control amplifier (GCA) 20 is set at a potential higher than ground (GND), the output level of the gain control amplifier (GCA) 20 may be fixed at an L level, whereby current does not flow through the oscillation loop even after a certain period of time.

The output level of the gain control amplifier (GCA) 20 may also be fixed at an H/L level when the potentials of the non-inverting terminal and the inverting terminal are subjected to undesirable DC offset due to manufacturing variations of the internal circuit of the gain control amplifier (GCA) 20, whereby current may not flow through the oscillation loop, for example. The vibrator 12 cannot be caused to produce vibrations when such a situation occurs, whereby the physical quantity cannot be measured.

Therefore, it is important to cause the vibrator 12 to reliably start oscillations even if an input offset voltage occurs in the GCA 20 or the comparator 50, for example. It is also important to cause the vibrator 12 to produce steady oscillations as early as possible to enable physical quantity measurement. Therefore, it is necessary to accelerate oscillation startup.

In this embodiment, the output level of the GCA 20 or the comparator 50 is reliably changed by changing a reference potential of the HPF 60 during oscillation startup, and the reference potential of the HPF 60 is fixed in a steady oscillation state so that oscillations continue in a normal oscillation loop. Specifically, the oscillation driver circuit 10 makes a phase adjustment using the HPF 60 to satisfy an oscillation condition in the oscillation loop, and accelerates oscillation startup by changing the reference potential of the HPF 60. The potential of a signal output from the high-pass filter (HPF) 60 (i.e., the potential of the input terminal of the GCA 20 and the comparator 50) changes by changing the reference potential of the high-pass filter (HPF) 60. Even if at least one of the GCA 20 and the comparator 50 is subjected to an input offset, the levels of the signals output from the GCA 20 and the comparator 50 necessarily change if the potential of the input terminal changes and the amplitude of the change exceeds the input offset. This causes current to flow through the vibrator 12, whereby the vibrator 12 reliably starts to oscillate.

The reference potential of the HPF 60 may be referred to as a potential which is supplied to a passive element or an active element of the HPF 60 separately from the oscillation signal in the oscillation loop and is used to obtain an output voltage utilizing the filtering function of the HPF 60. The HPF 60 is a first-order HPF formed of a passive element.

This allows energy to be injected into the vibrator 12 during oscillation startup due to a change in the reference potential of the HPF 60, whereby the oscillation startup time of the vibrator 12 can be reduced. Moreover, since the reference potential of the HPF 60 which changes is modulated to the resonance frequency of the vibrator 12 during oscillation startup, the oscillation condition does not differ to a large extent from the steady oscillation condition in the oscillation loop. Therefore, energy can be injected into the oscillation loop without hindering the oscillations of the vibrator, whereby oscillation startup can be efficiently achieved.

In the oscillation loop, the vibrator 12 generally allows only its resonance frequency component to pass through from white noise in the oscillation loop. As a result, only a resonance frequency signal component is amplified, whereby the vibrator 12 starts to oscillate. Specifically, an ordinary oscillation circuit amplifies only a resonance frequency component of the vibrator 12 from intrinsic noise (particularly white noise) in the oscillation loop to cause the vibrator 12 to oscillate. However, intrinsic noise changes to a large extent due to changes in temperature conditions, power supply conditions, and process conditions. Therefore, the period of time until a steady oscillation state occurs after oscillation startup also changes to a large extent due to changes in temperature conditions, power supply conditions, and process conditions. According to this embodiment, the vibrator 12 can be caused to reliably oscillate irrespective of changes in temperature conditions, power supply conditions, and process conditions, and the period of time until a steady oscillation state is achieved after oscillation startup can be reliably reduced.

The oscillation driver circuit 10 according to this embodiment may further include a reference potential change circuit 70 and a pulse generation circuit 80 in order to change the reference potential of the HPF 60. The reference potential change circuit 70 changes a reference potential VBH of the HPF 60. The reference potential change circuit 70 supplies one voltage level selected from a plurality of voltage levels to the HPF 60 as the reference potential during oscillation startup. The pulse generation circuit 80 generates a switch pulse PSW for selecting the voltage level output as the reference potential of the HPF 60.

Figure 2:
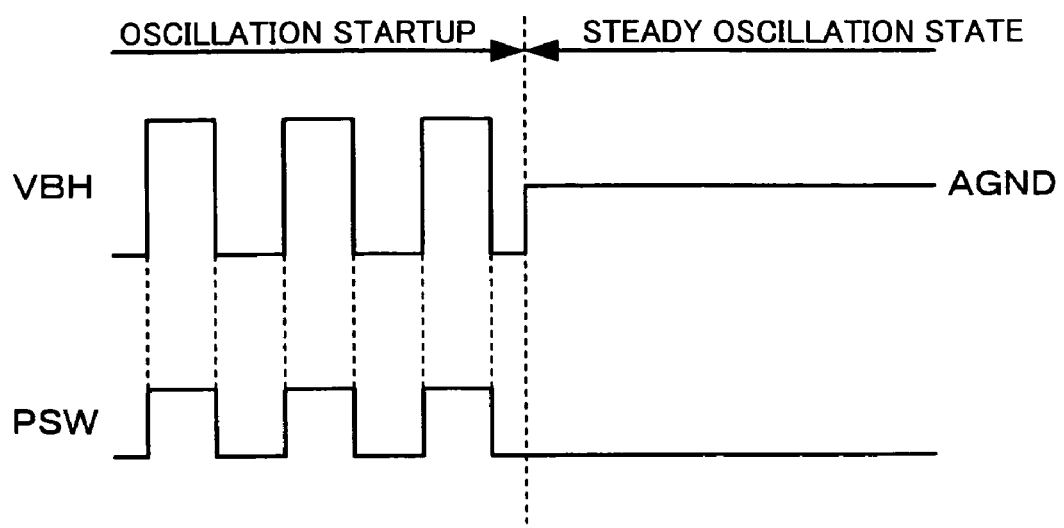
FIG. 2 is a view illustrative of a reference potential of an HPF and a switch pulse.

FIG. 2 is a view illustrative of the reference potential VBH of the HPF 60 and the switch pulse PSW.

The pulse generation circuit 80 generates the switch pulse PSW during oscillation startup so that the reference potential change circuit 70 changes the reference potential VBH of the HPF 60. The pulse generation circuit 80 fixes the switch pulse PSW in a steady oscillation state so that the reference potential change circuit 70 fixes the reference potential VBH of the HPF 60. The pulse generation circuit 80 can output the switch pulse only in a given period in this manner.

The HPF 60 may be formed of only a passive element or an active element. The HPF 60 may be formed of a passive element and an active element in combination. For example, the HPF 60 shown in FIG. 1 may be a first-order HPF. Note that the invention is not limited to the order of the HPF.

In FIG. 1, the GCA 20 and the comparator 50 are switched between oscillation startup and a steady oscillation state. Note that the invention is not limited thereto. For example, the GCA 20 and the first switching element SW1 or the comparator 50 and the second switching element SW2 may be omitted from FIG. 1.

1.1 Sleep Mode

The oscillation driver circuit 10 according to this embodiment has a normal mode for performing a normal operation (first operation mode in a broad sense) and a sleep mode for performing a sleep operation (second operation mode in a broad sense) as operation modes in order to reduce power consumption. A sleep mode setting register 90 is provided inside or outside the oscillation driver circuit 10. A control circuit (not shown) which controls the oscillation driver circuit 10 sets control data in the sleep mode setting register 90. The oscillation driver circuit 10 operates in an operation mode corresponding to the control data set in the sleep mode setting register 90. For example, when "0" is set in the sleep mode setting register 90, the oscillation driver circuit 10 operates in the normal mode. When "1" is set in the sleep mode setting register 90, the oscillation driver circuit 10 operates in the sleep mode, for example.

A sleep control signal SLEEP corresponding to the control data set in the sleep mode setting register 90 is supplied to the GCA 20, the AGC circuit 40, and the pulse generation circuit 80. When the oscillation driver circuit 10 operates in the sleep mode, the operations of the GCA 20 and the AGC circuit 40 are suspended. In this embodiment, the current-voltage converter 30 and the comparator 50 operate without being disabled (i.e., an enabled state is maintained) when the oscillation driver circuit 10 operates in the sleep mode.

The AGC circuit 40 includes a full-wave rectifier 42, an oscillation detector 44, and an integrator 46. The full-wave rectifier 42 converts the voltage value converted by the current-voltage converter 30 into a voltage value as a direct-current signal. The oscillation detector 44 detects whether or not the oscillation loop including the vibrator 12 is in an oscillation state based on the voltage value converted by the full-wave rectifier 42, and generates the switch control signal SWCTL# (or switch control signal SWCTL) as the detection result. For example, the oscillation detector 44 compares the voltage value converted by the full-wave rectifier 42 with a given reference voltage value, and generates the switch control signal SWCTL# (or switch control signal SWCTL) based on the comparison result. The integrator 46 generates a control signal VCTL for the GCA 20 to control oscillations in the oscillation loop based on an integration result of the voltage value converted by the full-wave rectifier 42. For example, the integrator 46 integrates the voltage value converted by the full-wave rectifier 42 to determine the level of the direct-current component, compares the determined level with a given reference signal level, and generates the control signal VCTL based on the comparison result. For example, the high-potential-side power supply voltage of a circuit (output circuit) in the output stage (final stage) of the GCA 20 is controlled based on the control signal VCTL.

Specifically, the sleep control signal SLEEP is supplied to the full-wave rectifier 42, the oscillation detector 44, and the integrator 46. The operations of the full-wave rectifier 42, the oscillation detector 44, and the integrator 46 are suspended when the sleep mode is designated by the sleep control signal SLEEP. The full-wave rectifier 42, the oscillation detector 44, and the integrator 46 operate when the normal mode is designated by the sleep control signal SLEEP.

In this embodiment, when the normal mode is set in the sleep mode setting register 90, the vibrator 12 is activated during oscillation startup by controlling the first and second switching elements SW1 and SW2, and the oscillation amplitude in the oscillation loop including the vibrator 12 and the GCA 20 is controlled in a steady oscillation state in a state in which the first switching element SW1 is turned ON and the second switching element SW2 is turned OFF. In this embodiment, oscillations continue in the oscillation loop including the vibrator 12 and the comparator 50 when the sleep mode is set in the sleep mode setting register 90. In this case, the AGC circuit 40 monitors the oscillation state and controls the oscillation amplitude of the GCA 20.

Figure 3A:
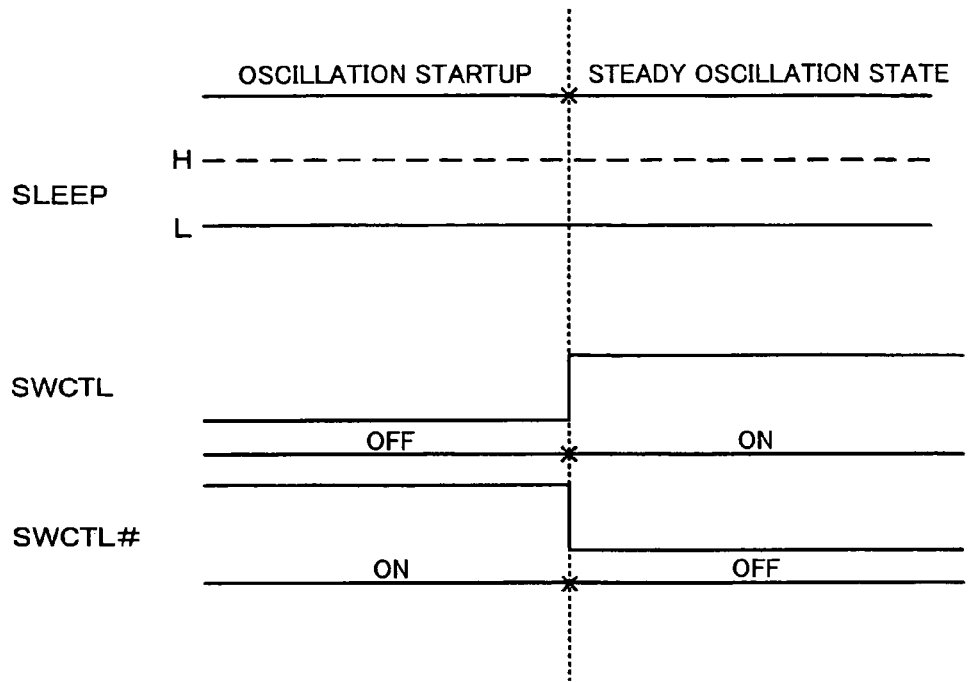
FIGS. 3A and 3B are timing diagrams showing an example of a sleep control signal and switch control signals shown in FIG. 1.
Figure 3B:
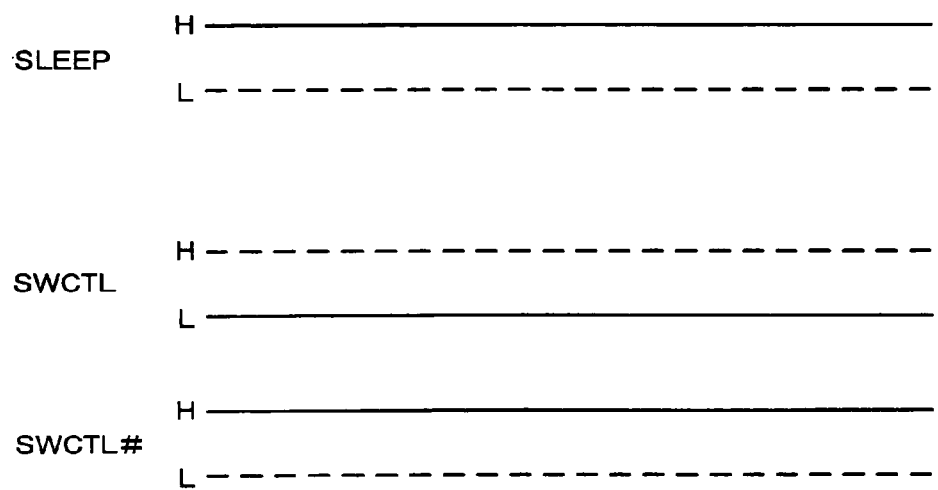

FIGS. 3A and 3B are timing waveform diagrams of the sleep control signal SLEEP and the switch control signals SWCTL and SWCTL#.

FIG. 3A is a timing waveform diagram in the normal mode, and FIG. 3B is a timing waveform diagram in the sleep mode.

In FIG. 3A, the oscillation driver circuit 10 operates in the normal mode when the sleep control signal SLEEP is set at the L level. During oscillation startup such as immediately after supplying power, the oscillation detector 44 of the AGC circuit 40 detects that the voltage value obtained by converting the current signal from the vibrator 12 is lower than the given reference voltage value, and the oscillation detector 44 generates the switch control signal SWCTL# set at the H level (or switch control signal SWCTL set at the L level). This causes the first switching element SW1 to be turned OFF and the second switching element SW2 to be turned ON. In this case, when the level of the input signal of the comparator 50 has exceeded a given threshold value, the comparator 50 amplifies the input signal by a very large gain to set the gain in the oscillation loop to be larger than unity. As a result, the vibrator 12 produces driving vibrations during oscillation startup so that the gain in the oscillation loop including the vibrator 12 and the comparator 50 is larger than unity and the phase in the oscillation loop is 360×n (n is an integer).

When the oscillation detector 44 has detected that the voltage value obtained by converting the current signal from the vibrator 12 is higher than the given reference voltage value, the oscillation detector 44 generates the switch control signal SWCTL# set at the L level (or switch control signal SWCTL set at the H level). This causes the first switching element SW1 to be turned ON and the second switching element SW2 to be turned OFF. In this case, the oscillation amplitude in the oscillation loop is controlled by the GCA 20 based on the control signal VCTL from the AGC circuit 40 so that the gain in the oscillation loop becomes unity. As a result, oscillation startup ends and transitions to a steady oscillation state. In the steady oscillation state, the vibrator 12 is caused to produce driving vibrations so that the gain in the oscillation loop including the vibrator 12 and the GCA 20 is unity and the phase in the oscillation loop is 360×n.

In this embodiment, the oscillation loop can be switched from the oscillation loop formed by the vibrator 12 and the comparator 50 to the oscillation loop formed by the vibrator 12 and the GCA 20 based on the detection result of the oscillation detector 44. Specifically, the above switch control is performed on condition that the oscillation detector 44 has detected that the direct-current voltage obtained by converting the current flowing through the vibrator 12 has reached the given threshold voltage. This enables the switching element to be switch-controlled utilizing the signal detection result from the vibrator 12 generally used to control oscillations in the oscillation loop, whereby a high-speed oscillation startup can be implemented without increasing the circuit scale to a large extent.

In FIG. 3B, the oscillation driver circuit 10 operates in the sleep mode when the sleep control signal SLEEP is set at the H level. In this case, the oscillation detector 44 generates the switch control signal SWCTL# set at the H level (or switch control signal SWCTL set at the L level) irrespective whether oscillation startup such as immediately after supplying power or a steady oscillation state occurs. This causes the first switching element SW1 to be turned OFF and the second switching element SW2 to be turned ON. Specifically, the oscillation driver circuit 10 is set in the same state as oscillation startup in the normal mode shown in FIG. 3A. In this case, when the level of the input signal of the comparator 50 has exceeded a given threshold value, the comparator 50 amplifies the input signal by a very large gain to set the gain in the oscillation loop to be larger than unity, as described above. As a result, the vibrator 12 produces driving vibrations during oscillation startup so that the gain in the oscillation loop including the vibrator 12 and the comparator 50 is larger than unity and the phase in the oscillation loop is 360×n (n is an integer). This makes it possible to suspend the operation of the AGC circuit 40 in the sleep mode to reduce power consumption. In the sleep mode, the oscillation state continues in the oscillation loop used during the oscillation startup state in the normal mode. Therefore, a high-speed oscillation startup can be achieved when the operation mode transitions from the sleep mode to the normal mode. Therefore, a driver device can be provided which can reduce the oscillation startup time without increasing the circuit scale when the driver device can operate in the sleep mode.

Note that a reliable and quicker oscillation startup may be performed when the operation mode transitions from the sleep mode to the normal mode using the switch control signal SWCTL (or switch control signal SWCTL#). In this case, the start timing of the given period in which the pulse generation circuit 80 outputs the switch pulse PSW is the switch timing from the sleep mode to the normal mode. The reference potential VBH of the HPF 60 changes during the given period which starts based on the switch tinning. This makes it possible to reliably reduce the oscillation startup time when recovering from the sleep mode. In this case, since the reference potential VBH is modulated to the resonance frequency of the vibrator 12, the oscillation condition does not differ to a large extent from the steady oscillation condition of the oscillation loop. Therefore, energy can be injected into the oscillation loop without hindering the oscillations of the vibrator. Therefore, oscillation startup can be efficiently achieved.

1.2 Current Limiting Function

When controlling the oscillation amplitude in the oscillation loop as described in this embodiment, current flowing through the vibrator 12 changes. The vibrator 12 may break when an excessive current flows through the vibrator 12 (e.g. when the current exceeds a given threshold value). In particular, when disabling the operation of the AGC circuit 40 in the sleep mode as described in this embodiment, the amplitude of the oscillation signal in the oscillation loop is not controlled, whereby an excessive current may flow through the vibrator 12.

In this embodiment, the comparator 50 has a current limiting function. The term "current limiting function" used herein may be referred to as a limiter function which prevents the current flowing through the vibrator 12 from reaching or exceeding a given value, for example.

As a comparative example, a method may be considered in which a protective resistor is inserted into the oscillation loop without operating the AGC circuit, for example. However, this method has a problem in that the gain in the oscillation loop decreases in the steady oscillation state, whereby power consumption increases. Moreover, the oscillation margin cannot be increased due to the low accuracy of the resistance of the protective resistor.

On the other hand, since the oscillation signal in the oscillation loop has a given amplitude during operation in the sleep mode by providing the current limiting function, a situation in which an excessive current flows through the vibrator 12 can be prevented while reducing power consumption without enabling the operation of the AGC circuit 40.

When the oscillation driver circuit 10 includes the AGC circuit 40 which controls the gain of the GCA 20 based on the oscillation signal in the oscillation loop, the oscillation driver circuit 10 can disable the operations of the GCA 20 and the AGC circuit 40 without disabling the operation of the comparator 50 (i.e., while enabling the operation of the comparator 50) when the oscillation driver circuit 10 is set in the sleep mode. In this case, since the operation of the AGC circuit 40 is not enabled, a situation in which an excessive current flows through the vibrator 12 can be prevented while reducing power consumption.

In this embodiment, the output from the comparator 50 is output as the synchronous detection clock signal in the steady oscillation state in the normal mode. Therefore, when measuring the physical quantity using the output signal obtained by synchronously detecting the detection signal output from the vibrator 12 based on driving vibrations produced by the vibrator 12 and the physical quantity to be measured, the synchronous detection process and oscillation startup can be accelerated without increasing the circuit scale.

It is preferable that the comparator 50 have a gain as large as possible. This makes it possible to increase the loop gain in the oscillation loop formed in the oscillation startup state, whereby the oscillation startup time can be reduced. Moreover, the accuracy of the synchronous detection clock signal output in the steady oscillation state can be increased.

It is preferable that the polarity (inversion and non-inversion) of the operational amplifier of the GCA 20 be the same as the polarity of the operational amplifier of the comparator 50. This makes it unnecessary to provide a circuit which reverses polarity, even if the oscillation loop is switched using the first and second switching elements SW1 and SW2, whereby an increase in circuit scale can be suppressed.

1.3 Specific Configuration Example

Figure 4:
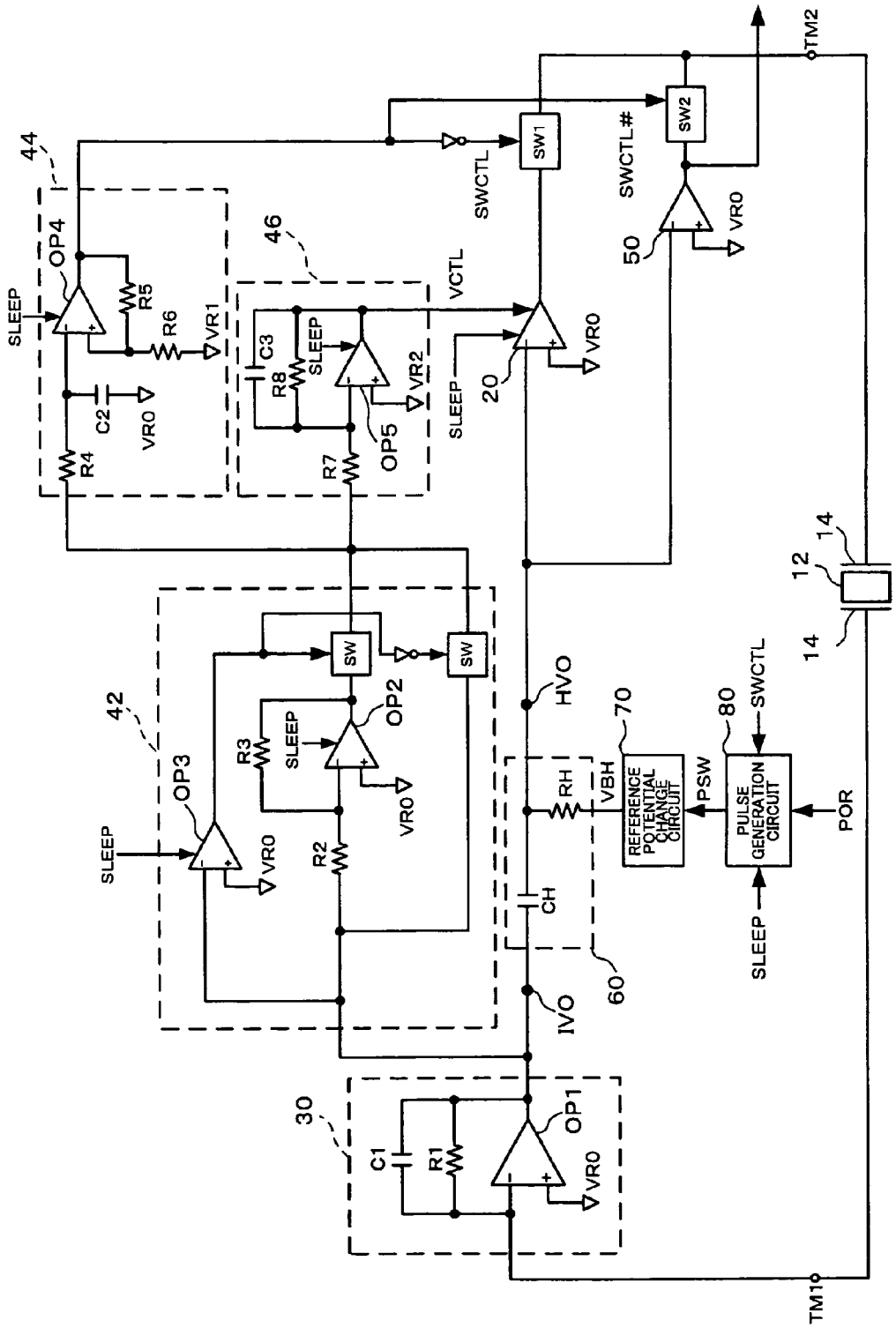
FIG. 4 is a view showing a circuit example of the oscillation driver circuit shown in FIG. 1.

FIG. 4 is a circuit diagram showing a configuration example of the oscillation driver circuit 10 shown in FIG. 1.

In FIG. 4, the same sections as in FIG. 1 are indicated by the same symbols. Description of these sections is appropriately omitted.

The current-voltage converter 30 includes an operational amplifier OP1, a feedback capacitor C1, and a feedback resistor R1. A given reference voltage VR0 is supplied to the non-inverting input terminal (+) of the operational amplifier OP1, and the first connection terminal TM1 is electrically connected with the inverting input terminal (−).

The full-wave rectifier 42 includes operational amplifiers OP2 and OP3 and resistors R2 and R3. The operational amplifier OP2 and the resistors R2 and R3 function as an inverting circuit. The operational amplifier OP3 functions as a comparator which compares the output voltage of the current-voltage converter 30 with the reference voltage VR0. The full-wave rectifier 42 includes a switching element provided on the output side of the operational amplifier OP2, and a switching element which bypasses the input and the output of the full-wave rectifier 42. These switching elements are exclusively ON/OFF-controlled based on the output signal from the operational amplifier OP3. When the sleep control signal SLEEP is set at the H level, the operations of the operational amplifiers OP2 and OP3 are stopped by terminating or limiting the operating currents of the operational amplifiers OP2 and OP3. When the sleep control signal SLEEP is set at the L level, the operational amplifiers OP2 and OP3 are operated by generating the operating currents of the operational amplifiers OP2 and OP3.

The oscillation detector 44 includes a low pass filter (hereinafter abbreviated as "LPF") and an operational amplifier OP4. The LPF includes a resistor R4 and a capacitor C2. The resistor R4 is inserted in series between the input and the output of the LPF. One end of the capacitor C2 is electrically connected with the output node of the LPF. A reference voltage VR1 is supplied to the other end of the capacitor C2. The cut-off frequency of the LPF is $1/(2\pi \times C2 \times R4)$. The output node of the LPF is connected with the inverting input terminal of the operational amplifier OP4. A resistor R5 is inserted as a feedback resistor between the output and the non-inverting input terminal of the operational amplifier OP4. The reference voltage VR1 is supplied to the non-inverting input terminal of the operational amplifier OP4 through a resistor R6. The output signal from the operational amplifier OP4 is output as the switch control signal SWCTL#. When the sleep control signal SLEEP is set at the H level, the operation of the operational amplifier OP4 is stopped by terminating or limiting the operating current of the operational amplifier OP4. When the sleep control signal SLEEP is set at the L level, the operational amplifier OP4 is operated by generating the operating current of the operational amplifier OP4.

The integrator 46 includes an operational amplifier OP5, resistors R7 and R8, and a capacitor C3. The capacitor C3 is connected as a feedback capacitor of the operational amplifier OP5. The resistor R8 is inserted as a feedback resistor of the operational amplifier OP5. The resistor R7 is inserted between the inverting input terminal of the operational amplifier OP5 and the output node of the full-wave rectifier 42. In the integrator 46, the gain is controlled while reducing the effects of the input voltage offset and the input current offset using the resistors R7 and R8. A reference voltage VR2 is supplied to the non-inverting input terminal of the operational amplifier OP5. The integrator 46 functions as an LPF utilizing the capacitor C3 and the resistor R8. The cut-off frequency is $1/(2\pi \times C3 \times R8)$. The output signal from the operational amplifier OP5 is supplied to the GCA 20 as the control signal VCTL. When the sleep control signal SLEEP is set at the H level, the operation of the operational amplifier OP5 is stopped by terminating or limiting the operating current of the operational amplifier OP5. When the sleep control signal SLEEP is set at the L level, the operational amplifier OP5 is operated by generating the operating current of the operational amplifier OP5.

The current which flows through the vibrator 12 during oscillation startup is referred to as Id, and the current which flows through the vibrator 12 in the steady oscillation state is referred to as Id'. The reference voltage VR2 is expressed by the following equation taking into account the smoothing by the current-voltage converter 30, $$VR2=(Id\times R1\times 2/\pi)+VR0 \quad (1)$$

where, R1 indicates the resistance of the feedback resistor of the current-voltage converter 30. Likewise, the reference voltage VR1 is expressed by the following equation.

$$VR1=(Id'\times R1\times 2/\pi)+VR0 \quad (2)$$

Since Id'<Id, the reference voltage VR2 is higher than the reference voltage VR1. It is preferable that the reference voltages VR1 and VR2 have the following relationship with the reference voltage VR0.

$$VR0<VR1<VR2 \quad (3)$$

When the sleep control signal SLEEP is set at the H level, the operation of the GCA 20 is stopped by terminating or limiting the operating current of the GCA 20. When the sleep control signal SLEEP is set at the L level, the GCA 20 is operated by generating the operating current of the GCA 20.

The HPF 60 is a first-order HPF which includes a capacitor (capacitor element) CH inserted between the output of the current-voltage converter 30 and the input of the GCA 20 or the comparator 50, and a resistor RH (resistor element), the reference potential VBH from the reference potential change circuit 70 being supplied to one end of the resistor RH, and the input of the GCA 20 or the comparator 50 being connected to the other end of the resistor RH.

In this embodiment, the HPF 60 is inserted between the output of the current-voltage converter 30 and the input of the GCA 20 or the comparator 50 so that the output from the current-voltage converter 30 is supplied to the full-wave rectifier 42. This prevents the AGC circuit 40 (full-wave rectifier 42, oscillation detector 44, and integrator 46) from being affected by a change in the reference potential of the HPF 60.

The reason therefor may be considered to be as follows. Since the output impedance of the operational amplifier OP1 included in the current-voltage converter 30 is very low with respect to the reference potential change circuit 70, the current-voltage converter 30 and the GCA 20 (or comparator 50) in the oscillation loop are connected as shown in FIG. 5 through the resistor RH and a capacitor CH.

Figure 5:
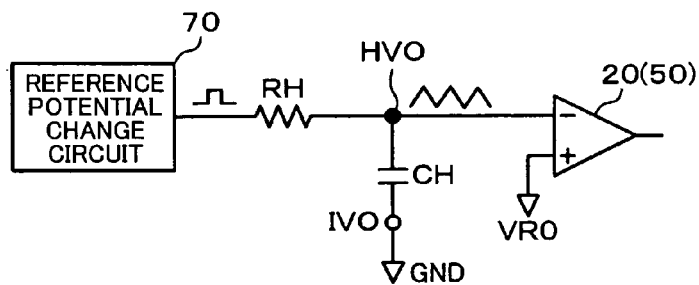
FIG. 5 s a view showing an example of an equivalent circuit with respect to a reference potential change circuit.

In FIG. 5, a node IVO corresponds to the output node of the current-voltage converter 30. The output impedance of the current-voltage converter 30 is very low. Therefore, it may be considered that the node IVO (output node of the current-voltage converter 30) is connected to ground GND. Therefore, a change in voltage caused by changing the reference potential of the high-pass filter (HPF) 60 is absorbed by the current-voltage converter 30. Accordingly, the full-wave rectifier 42 (see FIG. 1) connected with the oscillation loop is adversely affected to only a small extent.

The high-pass filter (HPF) 60 functions as a low-pass filter (LPF) which smoothes the signal from the reference potential change circuit 70. As shown in FIG. 5, the GCA 20 or the comparator 50 is connected with the reference potential change circuit 70 through a low-pass filter (LPF) formed of the resistor RH and the capacitor CH. Therefore, even if the reference potential is changed by the reference potential change circuit 70 in a pulsed manner, the waveform of the change in the reference potential becomes rounded via the low-pass filter (LPF). Specifically, only a low-frequency component contained in the pulse is transmitted. If the inputs of the GCA 20 and the comparator 50 change at a low frequency and the amplitude of the change exceeds the input offset voltage of the GCA 20 or the comparator 50 to only a small extent, the levels of the output signals of the GCA 20 and the comparator 50 change, whereby oscillations reliably start. The waveform of the change is not a steep pulsed waveform. The amplitude of the change may be a minimum amplitude which exceeds the input offset voltage. Therefore, the change does not adversely affect normal oscillations.

Suppose that a given signal (i.e., change in potential caused by changing the reference potential of the HPF 60) is applied to the signal in the oscillation loop on the input side of the current-voltage converter 30, for example. In this case, the change in potential affects the operations of the full-wave rectifier 42, the oscillation detector 44, and the integrator 46. This is disadvantageous from the viewpoint of causing stable oscillations.

According to this embodiment, the AGC circuit 40 can be prevented from being affected by a change in the reference potential of the HPF 60, as described above. Therefore, this embodiment prevents malfunction of the AGC circuit 40 due to a change in the reference potential of the HPF 60.

A detailed configuration example of each section is described below.

1.3.1 GCA

Figure 6A:
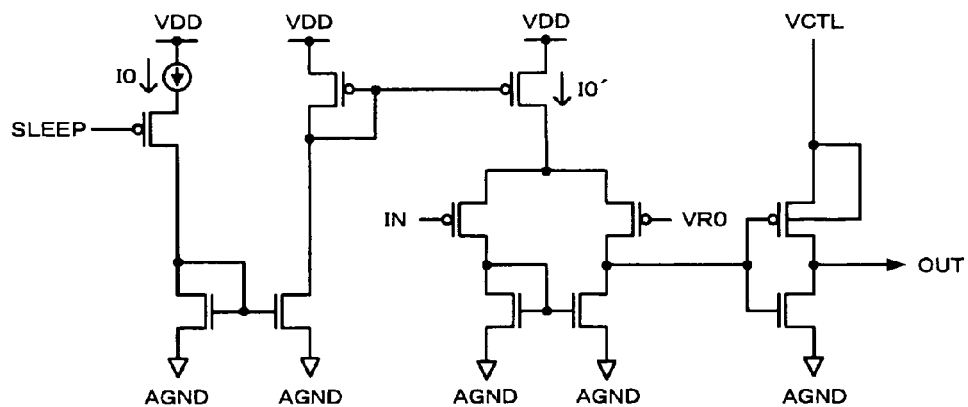
FIGS. 6A and 6B are circuit diagrams showing configuration examples of a GCA.
Figure 6B:
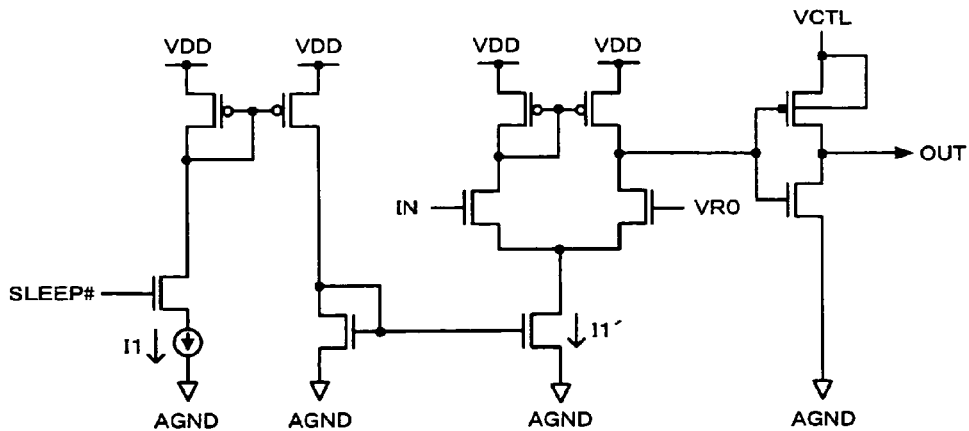

FIGS. 6A and 6B are circuit diagrams showing a configuration example of the GCA 20 shown in FIG. 4.

FIG. 6A shows a configuration example when forming the GCA 20 using a P-type differential amplifier, and FIG. 6B shows a configuration example when forming the GCA 20 using an N-type differential amplifier. In FIGS. 6A and 6B, a sleep control signal SLEEP# is an inversion signal of the sleep control signal SLEEP.

In FIG. 6A, a current I0 generated by a current source is supplied as an operating current I0' of the P-type differential amplifier through two current-mirror circuits. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied to an output buffer. The signal output from the output buffer is supplied to one end of the first switching element SW1.

The high-potential-side power supply voltage and the low-potential-side power supply voltage of the two current-mirror circuits and the P-type differential amplifier are voltages VDD and AGND, respectively. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

In FIG. 6B, a current I1 generated by a current source is supplied as an operating current I1' of the N-type differential amplifier through two current-mirror circuits. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied to an output buffer. The signal output from the output buffer is supplied to one end of the first switching element SW1.

The high-potential-side power supply voltage and the low-potential-side power supply voltage of the two current-mirror circuits and the N-type differential amplifier are the voltages VDD and AGND, respectively. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

In FIGS. 6A and 6B, a substrate bias effect can be prevented by applying the control signal VCTL as the substrate potential of the P-type output transistor of the output buffer.

In FIGS. 6A and 6B, a current control transistor is provided in series with the current source. In FIG. 6A, the current source transistor is formed of a P-type transistor, and the sleep control signal SLEEP is supplied to the gate of the transistor. In FIG. 6B, the current source transistor is formed of an N-type transistor, and the sleep control signal SLEEP# is supplied to the gate of the transistor. According to the configurations shown in FIGS. 6A and 6B, the source and the drain of the current control transistor are electrically disconnected when the sleep control signal SLEEP is set at the H level, whereby the current generated by the current source is not supplied to the current-mirror circuit. Therefore, the operation of the GCA 20 can be disabled (stopped) based on the sleep control signal SLEEP.

1.3.2 Comparator

The configuration of the comparator 50 (particularly the configuration which implements the current limiting function of the comparator 50) is described below. The power supply voltage VDD is supplied to the comparator 50 as the high-potential-side power supply. The analog power supply voltage AGND is supplied to the comparator 50 as the low-potential-side power supply. The current limiting function of the comparator 50 is a function of limiting current which flows through a current path connected to at least one of the high-potential-side power supply and the low-potential-side power supply.

Figure 7:
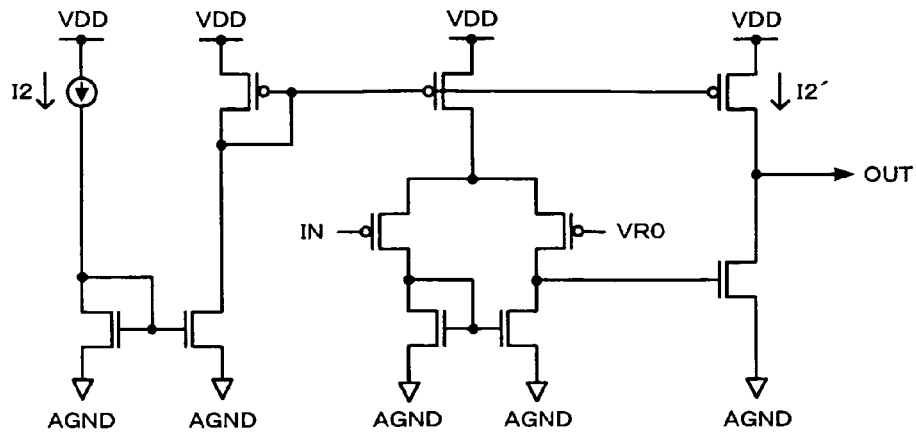
FIG. 7 is a circuit diagram showing a configuration example of a comparator shown in FIG. 4.

FIG. 7 is a circuit diagram showing a configuration example of the comparator 50 shown in FIG. 4.

In FIG. 7, a current I2 generated by a current source is supplied as the operating current of a P-type differential amplifier through two current-mirror circuits, and is supplied as a drain current I2' of a P-type output driver transistor. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied as a gate voltage of an N-type output driver transistor.

The P-type output driver transistor and the N-type output driver transistor are connected in series between the power supply voltage VDD and the analog power supply voltage AGND, and the voltage of the connection node of the P-type output driver transistor and the N-type output driver transistor (drain of the P-type output driver transistor) is supplied to one end of the second switching element SW2 as the output voltage.

In the comparator 50 shown in FIG. 7, the high-potential-side current drive capability of the output voltage OUT is limited by the current I2'. The high-potential-side current drive capability is limited in FIG. 7 as compared with the configuration shown in FIGS. 6A and 6B in which the same signal is supplied to the gates of the P-type output transistor and the N-type output transistor forming the output buffer, for example.

The configuration of the comparator 50 is not limited to the configuration shown in FIG. 7.

Figure 8:
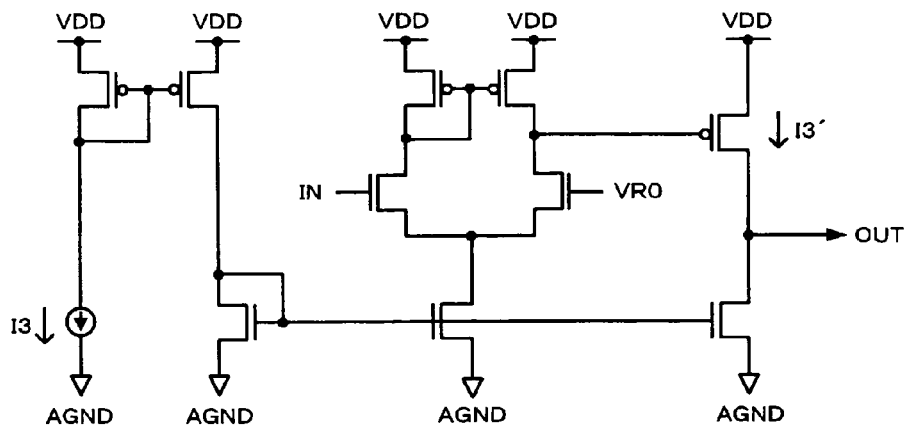
FIG. 8 is a circuit diagram showing another configuration example of the comparator shown in FIG. 4.

FIG. 8 is a circuit diagram showing another configuration example of the comparator 50 shown in FIG. 4.

In FIG. 8, a current I3 generated by a current source is supplied as the operating current of an N-type differential amplifier through two current-mirror circuits, and is supplied as a drain current I3' of an N-type output driver transistor. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied as a gate voltage of a P-type output driver transistor.

The P-type output driver transistor and the N-type output driver transistor are connected in series between the power supply voltage VDD and the analog power supply voltage AGND, and the voltage of the connection node of the P-type output driver transistor and the N-type output driver transistor (drain of the N-type output driver transistor) is supplied to one end of the second switching element SW2 as the output voltage.

In the comparator 50 shown in FIG. 8, the high-potential-side current drive capability of the output voltage OUT is limited by the current I3'. The high-potential-side current drive capability is limited in FIG. 8 as compared with the configuration shown in FIGS. 6A and 6B in which the same signal is supplied to the gates of the P-type output transistor and the N-type output transistor forming the output buffer, for example.

In FIGS. 7 and 8, the current in the current path connected to at least one of the high-potential-side power supply and the low-potential-side power supply is limited. Note that the current in the current paths connected to the high-potential-side power supply and the low-potential-side power supply may be limited.

Figure 9:
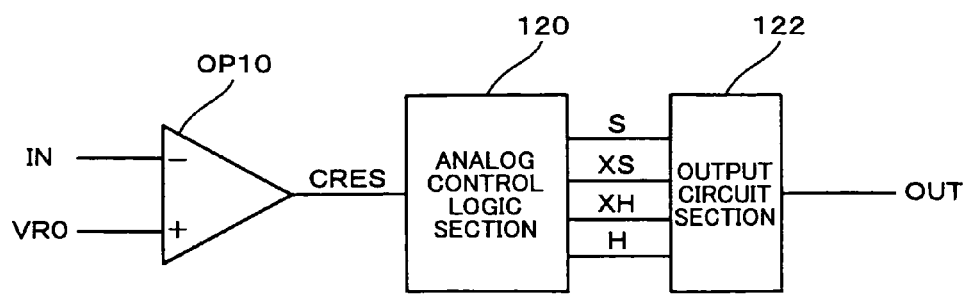
FIG. 9 is a circuit diagram showing yet another configuration example of the comparator shown in FIG. 4.

FIG. 9 is a circuit diagram showing a further configuration example of the comparator 50 shown in FIG. 4.

In FIG. 9, the comparator 50 may include an operational amplifier OP10, an analog control logic section 120, and an output circuit section 122. The operational amplifier OP10 functions as a comparator. The operational amplifier OP10 compares the output signal from the current-voltage converter 30 as the input signal with the reference voltage VR0, and outputs a comparison result signal CRES. The analog control logic section 120 generates control signals S, XS, XH, and H which control the output circuit section 122 based on the comparison result signal CRES generated by the operational amplifier OP10. The output circuit section 122 generates the output signal while limiting the current supplied from the high-potential-side power supply or the current supplied to the low-potential-side power supply based on the control signals S, XS, XH, and H from the analog control logic section 120.

Figure 10A:
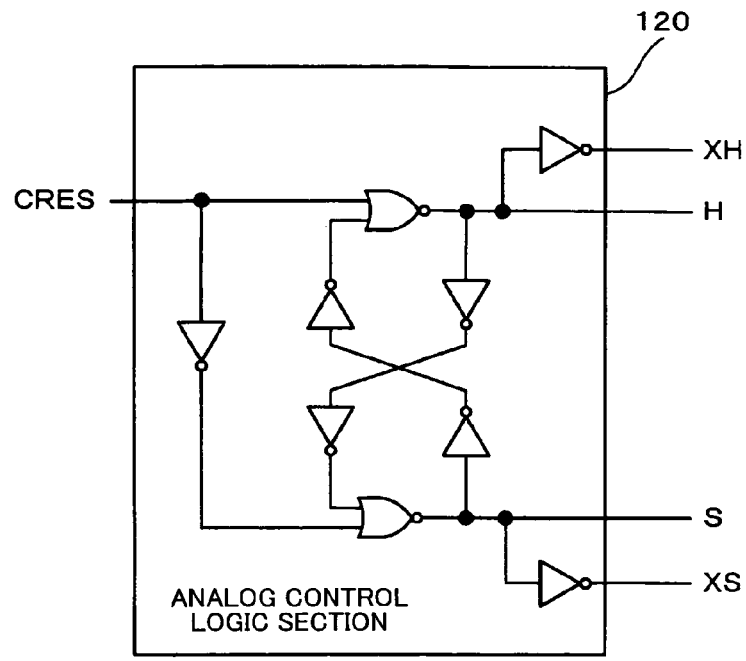
FIG. 10A is a circuit diagram showing a configuration example of an analog control logic section shown in FIG. 9.
Figure 10B:
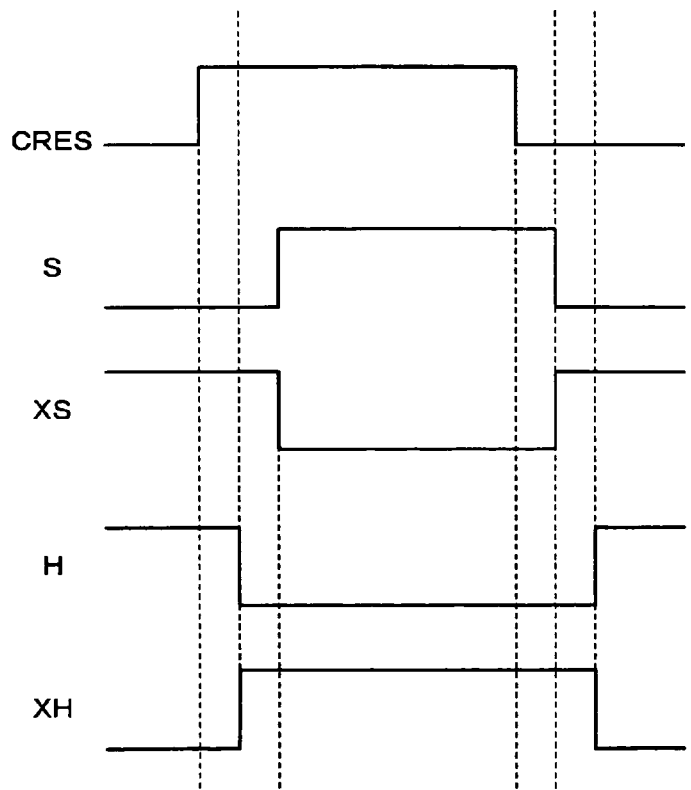
FIG. 10B is a timing diagram showing an operation example of the analog control logic section shown in FIG. 10A.

FIG. 10A is a circuit diagram showing a configuration example of the analog control logic section 120 shown in FIG. 9. FIG. 10B is a timing diagram showing an operation example of the analog control logic section 120 shown in FIG. 10A.

The analog control logic section 120 generates the control signals S and H based on the comparison result signal CRES so that the control signals S and H change at different timings The control signal XS is an inversion signal of the control signal S. The control signal XH is an inversion signal of the control signal H. In FIG. 10A, the comparison result signal CRES and its inversion signal are respectively input to two-input, one-output NOR circuits. The other input signal of the first NOR circuit is a signal generated by delaying the signal output from the second NOR circuit, and the other input signal of the second NOR circuit is a signal generated by delaying the signal output from the first NOR circuit. According to this configuration, the control signal H rises based on the falling edge of the control signal S, and the control signal S rises based on the falling edge of the control signal H.

Therefore, the control signals S and H are generated so that the H-level periods do not overlap. Likewise, the control signals XS and XH are generated so that the L-level periods do not overlap.

Figure 11:
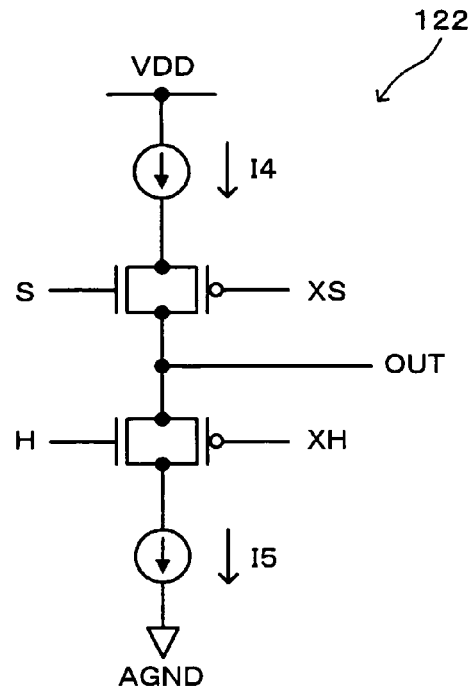
FIG. 11 is a view showing a configuration example of an output circuit section shown in FIG. 9.

FIG. 11 shows a configuration example of the output circuit section 122 shown in FIG. 9.

The output circuit section 122 includes first and second transfer gates, a first current source to which the power supply voltage VDD is supplied at one end and the first transfer gate is connected at the other end, and a second current source to which the second transfer gate is connected at one end and the analog power supply voltage AGND is supplied at the other end. The first current source generates a current 14. The second current source generates a current 15. The first and second transfer gates are connected in series, and the voltage of the connection node of the first and second transfer gates is output as the output voltage OUT of the comparator 50. The control signals XS and S are respectively supplied to the gates of a P-type transistor and an N-type transistor forming the transfer gate connected with the first current source. The control signals XH and H are respectively supplied to the gates of a P-type transistor and an N-type transistor forming the transfer gate connected with the second current source.

According to this configuration, the first and second transfer gates are controlled so that these transfer gates are not turned ON at the same time. The second transfer gate is turned OFF when the first transfer gate is turned ON, whereby the output voltage OUT changes in a state in which the current is limited by the current 14 of the first current source. Likewise, the first transfer gate is turned OFF when the second transfer gate is turned ON, whereby the output voltage OUT changes in a state in which the current is limited by the current 15 of the second current source.

1.3.3 Reference Potential Change Circuit and Pulse Generation Circuit

Configuration examples of the reference potential change circuit 70 and the pulse generation circuit 80 shown in FIG. 4 are described below.

Figure 12:
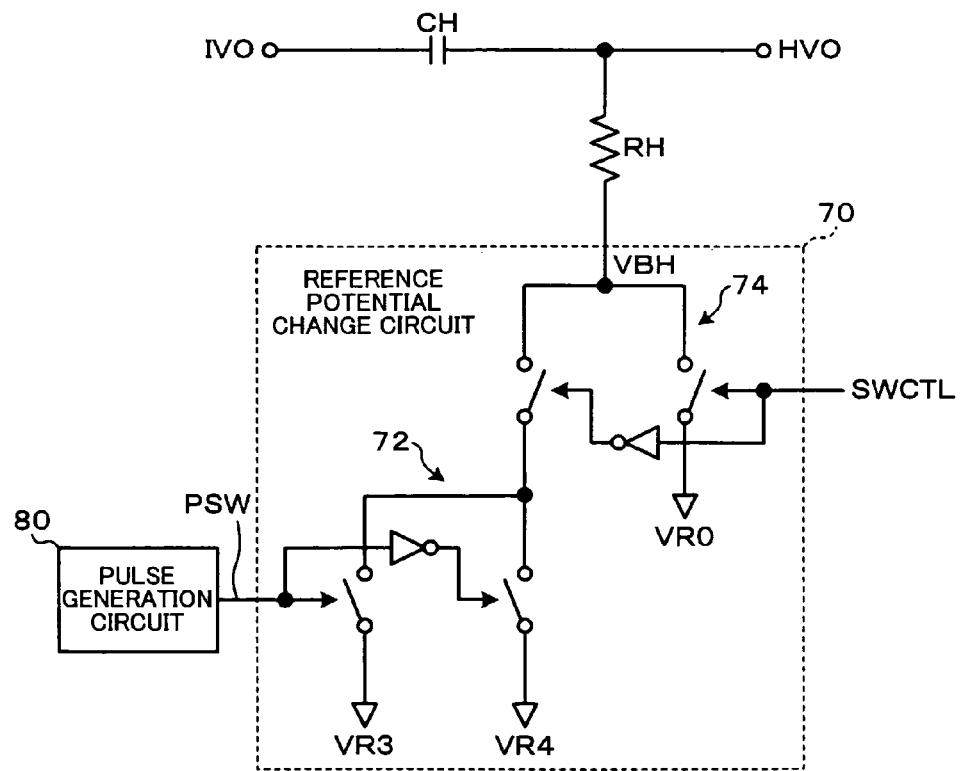
FIG. 12 is a view showing a configuration example of a reference potential change circuit shown in FIG. 1.

FIG. 12 shows a configuration example of the reference potential change circuit 70 shown in FIG. 4.

FIG. 12 shows a configuration example of the HPF 60 and the reference potential change circuit 70 so that the connection relationship with the HPF 60 is clearly understood.

Figure 13:
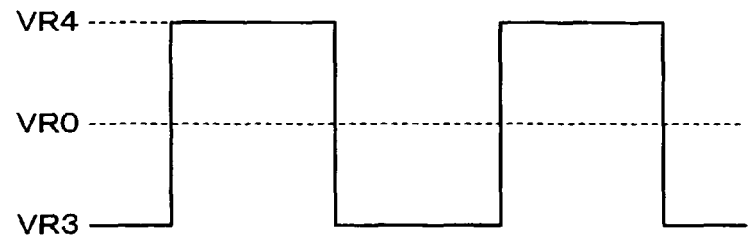
FIG. 13 is a view illustrative of a switch pulse.

The voltages VR0, VR3, and VR4 generated inside or outside of the oscillation driver circuit 10 are supplied to the reference potential change circuit 70. As shown in FIG. 13, the voltage VR0 serves as the reference potential of the HPF 60 in a steady oscillation state. The voltage VR4 is a high-potential-side voltage when changing the reference potential of the HPF 60. The voltage VR3 is a low-potential-side voltage when changing the reference potential of the HPF 60. Specifically, VR3<VR0<VR4 is satisfied. When the reference potential of the HPF 60 in a steady oscillation state is referred to as V0, the reference potential VBH is a potential obtained by alternately switching between the voltage V4 higher in potential than the voltage V0 and the voltage V3 lower in potential than the voltage V0 in a period in which the reference potential VH is changed. This enables the reference potential of the HPF 60 to be promptly stabilized at the voltage VR0 irrespective of the change process when a transition from oscillation startup to a steady oscillation state occurs.

The amplitude of the reference potential of the HPF 60 changed by the reference potential change circuit 70 is determined by the voltage between the voltages VR4 and VR3. As described above, the output level of the GCA 20 or the comparator 50 may not change due to the input offset voltage of the GCA 20 or the comparator 50. This makes it necessary to reliably change the output of the GCA 20 or the comparator 50 in order to reliably accelerate oscillation startup. Therefore, it is desirable that the amplitude of the reference potential of the HPF 60 changed by the reference potential change circuit 70 be greater than the amplitude of the input offset voltage of the GCA 20 or the comparator 50 (or the amplitude of at least one of the input offset voltage of the GCA 20 and the input offset voltage of the comparator 50).

Specifically, the reference potential VBH output from the reference potential change circuit 70 is supplied to the GCA 20 or the comparator 50 through the LPF having a configuration shown in FIG. 5. When the capacitance of the capacitor CH is referred to as C and the resistance of the resistor RH is referred to as R, the transfer function of the LPF shown in FIG. 5 is expressed by the following equation, $$V\text{out}/V\text{in}=1/(1+j\times\omega C\times R) \tag{4}$$

where, j indicates an imaginary axis in a complex plane, and ω indicates each frequency. When Vin is (V4−V3) and Vin=ΔV, it suffices that Vout be higher than the input offset voltage Vx of the GCA 20 or the comparator 50. Therefore, the relationship between the input offset voltage Vx and the equation (4) is expressed by the following equation.

$$Vx<V\text{out}=\Delta V/((1+(\omega\times C\times R)^2)^{1/2} \tag{5}$$

Specifically, it is desirable that the input offset voltage Vx of the GCA 20 or the input offset voltage Vx of the comparator 50 be smaller than $\Delta V/((1+(\omega\times C\times R)^2)^{1/2}$. This makes it possible to change the output of the GCA 20 or the comparator 50 irrespective of the input offset voltage of the GCA 20 or the input offset voltage of the comparator 50, so oscillation startup can be reliably accelerated.

The voltages VR0, VR3, and VR4 may be voltages generated by dividing the power supply voltage VDD or another voltage using resistors. This makes it possible to easily change at least one of the voltages VR0, VR3, and VR4, more reliable oscillations can be achieved by absorbing manufacturing variations and a change in oscillation environment.

The reference potential change circuit 70 which generates the reference potential VBH shown in FIG. 13 during oscillation startup may include selectors 72 and 74, for example. The selector 72 selectively outputs the voltage VR3 or VR4 based on the switch pulse PSW from the pulse generation circuit 80. The selector 74 outputs the voltage VR0 or the output from the selector 72 as the reference potential VBH based on the switch control signal SWCTL.

Figure 14:
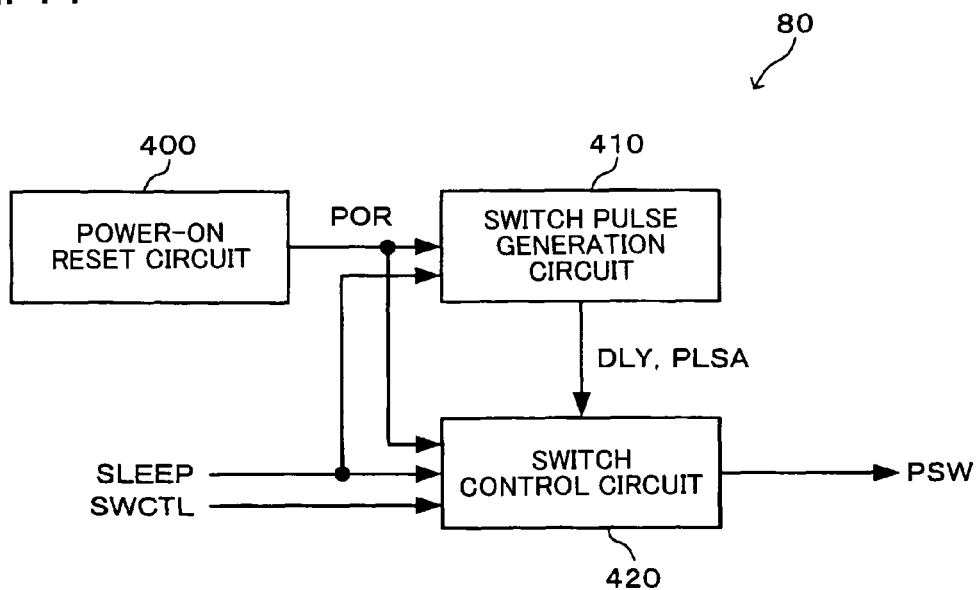
FIG. 14 is a block diagram showing a configuration example of a pulse generation circuit shown in FIG. 1.

FIG. 14 is a block diagram showing a configuration example of the pulse generation circuit 80 shown in FIG. 4.

The pulse generation circuit 80 includes a power-on reset circuit 400, a switch pulse generation circuit 410, and a switch control circuit 420.

Figure 15:
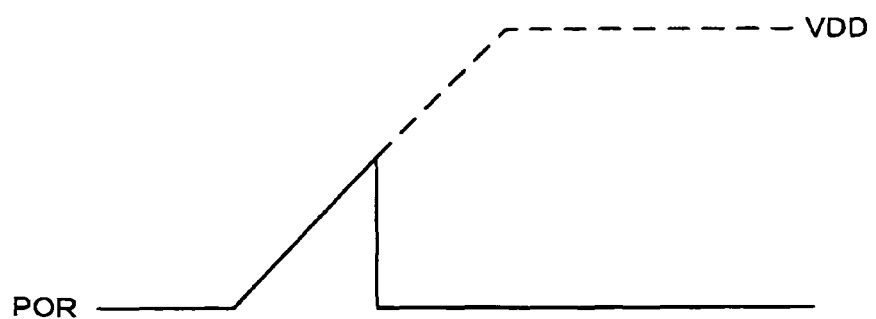
FIG. 15 is a view illustrative of a power-on reset circuit shown in FIG. 14.

The power-on reset circuit 400 generates a power-on reset signal POR shown in FIG. 15. Specifically, the power-on reset circuit 400 generates the power-on reset signal POR so that the power-on reset signal POR becomes active when the high-potential-side power supply voltage has reached a given threshold value level during a period from the time immediately after supplying power to the time at which the high-potential-side power supply voltage reaches the voltage VDD. The power-on reset circuit 400 may be configured using a known circuit.

The switch pulse generation circuit 410 generates a pulse signal PLSA which contains one or more pulses in a given period based on the power-on reset signal POR from the power-on reset circuit 400 and the sleep control signal SLEEP. The switch pulse generation circuit 410 outputs a delay signal DLY which is set at the H level in the above period.

Figure 16A:
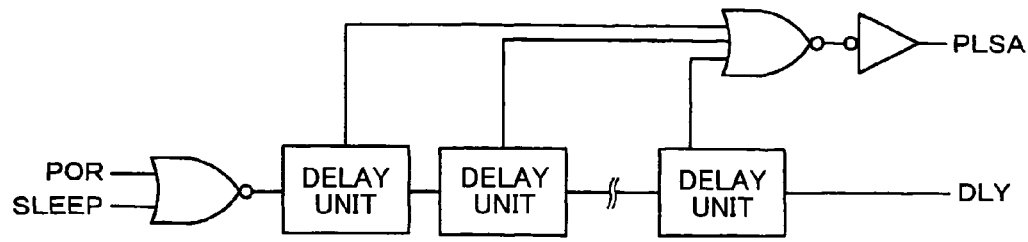
FIGS. 16A to 16D are views illustrative of a switch pulse generation circuit shown in FIG. 14.
Figure 16B:
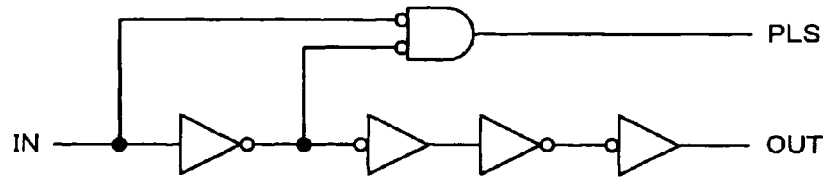
Figure 16C:
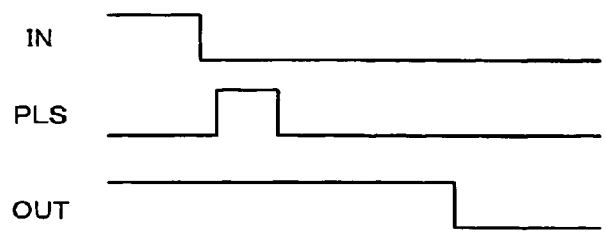
Figure 16D:
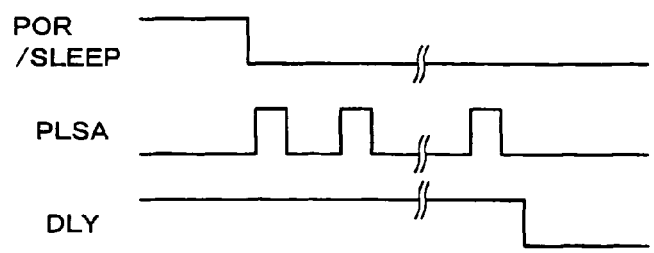

FIGS. 16A to 16D are views illustrative of the switch pulse generation circuit 410 shown in FIG. 14. FIG. 16A is a block diagram showing a configuration example of the switch pulse generation circuit 410 shown in FIG. 14. FIG. 16B is a circuit diagram and a timing diagram showing a configuration example of a delay unit shown in FIG. 16A. FIG. 16C shows a timing example of the delay unit shown in FIG. 16B. FIG. 16D is a timing diagram showing an operation example of the switch pulse generation circuit 410 shown in FIG. 16A.

As shown in FIG. 16A, the switch pulse generation circuit 410 includes a plurality of delay units. Each delay unit generates one pulse based on an input signal. A signal of the negative OR result of the power-on reset signal POR and the sleep control signal SLEEP is input to the delay unit in the first stage. The output from the delay unit in the final stage is output as the delay signal DLY. The pulses generated by the delay units are logical ORed and output as the pulse signal PLSA.

As shown in FIGS. 16B and 16C, the delay unit delays the input signal IN using inverters, and generates an output signal OUT which is input to the delay unit in the subsequent stage. The pulse signal PLS output from each delay unit is generated by the input and the output of a first-stage inverter circuit of the inverters, and is output as a falling-edge detection pulse of the input signal IN. The pulse signal PLSA is generated by logical ORing the pulse signals PLS from the delay units. The output signal OUT falls after a delay time due to the inverters based on the falling edge of the input signal IN.

The pulse signal PLSA having pulses in the number of delay units in a given period which starts based on the falling edge of the power-on reset signal POR as shown in FIG. 16D is generated by logical ORing the pulse signals from the delay units shown in FIGS. 16B and 16C.

Again referring to FIG. 14, the sleep control signal SLEEP, the switch control signal SWCTL# (or switch control signal SWCTL) from the oscillation detector 44, the power-on reset signal POR from the power-on reset circuit 400, and the delay signal DLY and the pulse signal PLSA from the switch pulse generation circuit 410 are input to the switch control circuit 420 shown in FIG. 14. The switch control circuit 420 generates the switch pulse PSW having one or more pulses in a given period based on the switch control signal SWCTL, the power-on reset signal POR, the delay signal DLY, and the pulse signal PLSA. The switch control circuit 420 can fix the logic level of the switch pulse PSW based on the sleep control signal SLEEP.

Figure 17A:
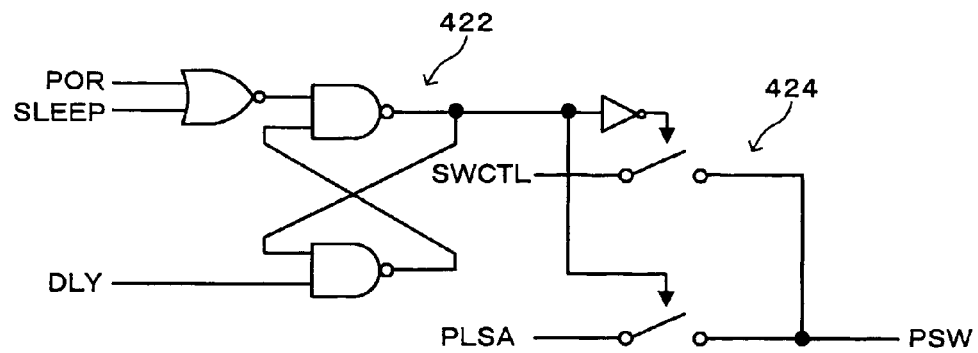
FIGS. 17A and 17B are views illustrative of a switch control circuit shown in FIG. 14.
Figure 17B:
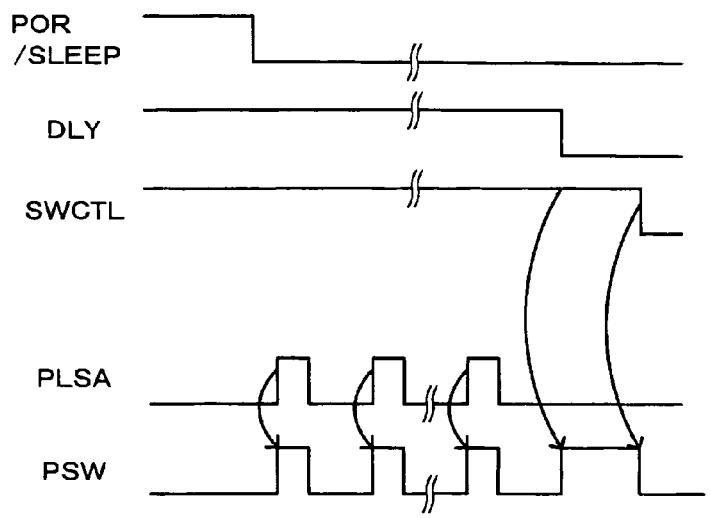

FIG. 17A is a circuit diagram of a configuration example of the switch control circuit 420 shown in FIG. 14. FIG. 17B is a timing diagram showing an operation example of the switch control circuit 420 shown in FIG. 17A.

The switch control circuit 420 includes an RS flip-flop 422 and a selector 424 which is controlled based on a signal output from the RS flip-flop 422. The signal of the negative OR result of the power-on reset signal POR and the sleep control signal SLEEP is input to the switch control circuit 420 as a set input of the RS flip-flop 422, and the delay signal DLY is input to the switch control circuit 420 as a reset input of the RS flip-flop 422. The switch control signal SWCTL (switch control signal SWCTL#) from the oscillation detector 44 and the pulse signal PLSA from the switch pulse generation circuit 410 are input to the selector 424. The switch control signal SWCTL or the pulse signal PLSA is selectively output based on the signal output from the RS flip-flop 422. The signal output from the selector 424 is output as the switch pulse PSW. When the sleep control signal SLEEP is set at the H level, the switch control circuit 420 outputs the switch pulse PSW set at the H level. When, the sleep control signal SLEEP is set at the L level, the switch control circuit 420 outputs the signal output from the selector 424 as the switch pulse PSW.

Therefore, the output signal of the RS flip-flop 422 is set when the power-on reset signal POR has fallen, whereby the selector 424 selectively outputs the pulse signal PLSA. When the sleep control signal SLEEP is set at the L level, the switch control circuit 420 outputs the pulse signal PLSA as the switch pulse PSW. The output signal of the RS flip-flop 422 is reset when the delay signal DLY has fallen, whereby the selector 424 selectively outputs the switch control signal SWCTL. When the sleep control signal SLEEP is set at the L level, the switch control circuit 420 outputs the switch control signal SWCTL as the switch pulse PSW.

According to the above configuration, the pulse generation circuit 80 can output the switch pulse PSW (signal at a given frequency) having one or more pulses in a period from the falling edge (change timing) of the power-on reset signal POR to the falling edge (change timing) of the switch control signal SWCTL which indicates that the signal in the oscillation loop has exceeded a given threshold value level.

The convenience to the user can be increased by specifying the start timing as described in this embodiment. Moreover, since the length of the given period can be specified by counting a given reference clock signal based on the start timing, the oscillation detector 44 which detects the oscillation amplitude can be omitted, whereby the circuit scale can be reduced, for example.

In FIGS. 14 to 17A and 17B, pulses equal to the number of delay units are generated. Note that the invention is not limited thereto. The number of pulses of the output from the oscillation circuit may be counted based on the change timing of the power-on reset signal POR, and the output from the oscillation circuit may be output as the switch pulse PSW in a period until a given count value is reached. In this case, the finish timing of the given period in which the pulse generation circuit 80 outputs the switch pulse PSW is the timing at which a given number of pulses has been counted based on the start timing of the given period.

1.4 Modification

In FIG. 12, the reference potential change circuit 70 generates the reference potential VBH which changes between the high-potential-side voltage VR4 and the low-potential-side voltage VR3 with respect to the voltage VR0 during oscillation startup. Note that the invention is not limited thereto.

Figure 18A:
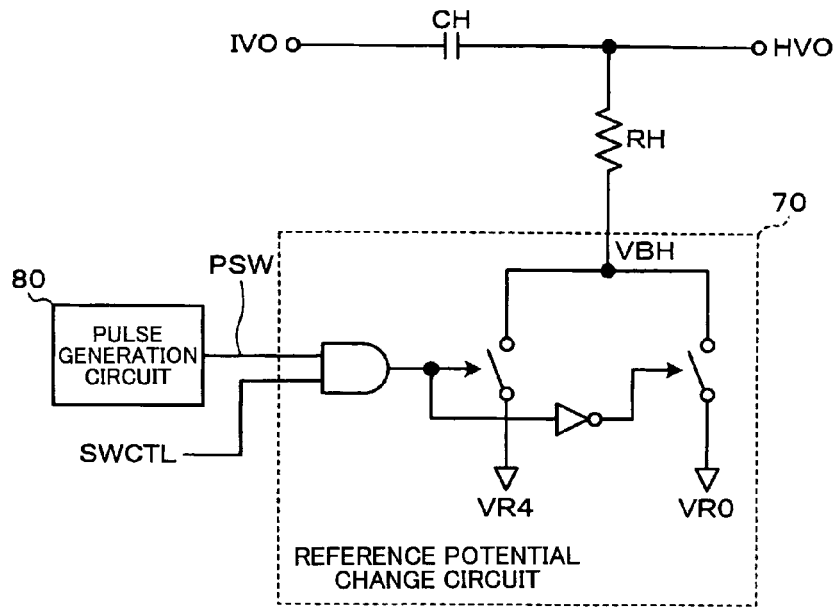
FIGS. 18A and 18B are views showing configuration examples of a reference potential change circuit according to a modification of one embodiment of the invention.
Figure 18B:
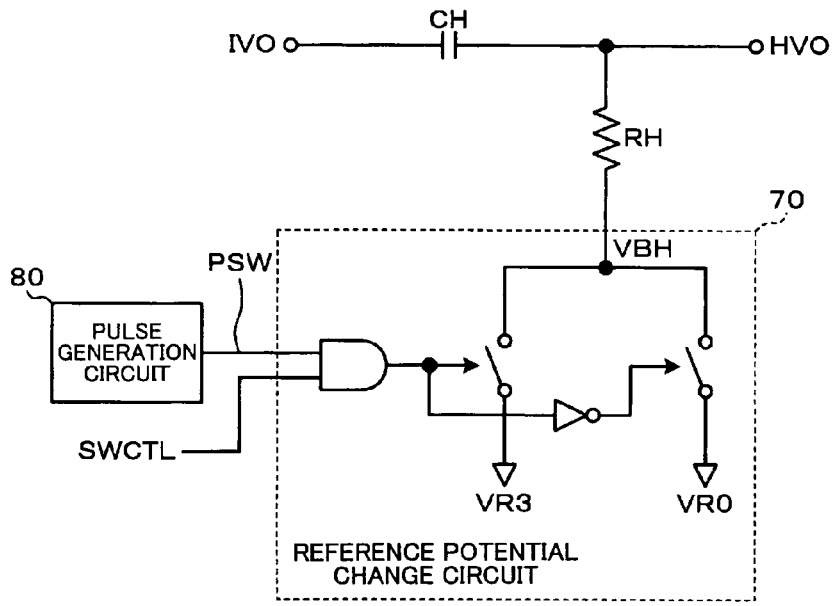

FIGS. 18A and 18B show configuration examples of the reference potential change circuit in according to a modification of this embodiment.

When the deflection of the input offset voltage due to manufacturing variations of the GCA 20 or the comparator 50 and the like has been determined in advance, the reference potential change circuit 70 may generate the reference potential VBH which alternately changes between the voltages VR0 and VR4 or the reference potential VBH which alternately changes between the voltages VR3 and VR0 during oscillation startup.

FIG. 18A shows an example in which the reference potential change circuit 70 generates the reference potential VBH which alternately changes between the voltages VR0 and VR4 during oscillation startup. In this case, the reference potential change circuit 70 outputs the voltage VR4 or VR0 as the reference potential VBH based on a select control signal obtained by masking the switch pulse PSW from the pulse generation circuit 80 using the switch control signal SWCTL.

FIG. 18B shows an example in which the reference potential change circuit 70 generates the reference potential VBH which alternately changes between the voltages VR3 and VR0 during oscillation startup. In this case, the reference potential change circuit 70 outputs the voltage VR3 or VR0 as the reference potential VBH based on the select control signal obtained by masking the switch pulse PSW from the pulse generation circuit 80 using the switch control signal SWCTL.

1.5 Oscillation Conditions During Oscillation Startup and Stable Oscillations

The oscillation driver circuit (driver device) 10 shown in FIG. 1 drives a physical quantity transducer 12 by means of the oscillation loop. In the oscillation driver circuit 10 according to this embodiment, the loop gain is set to be larger than unity during oscillation startup in order to enable high-speed startup. Specifically, the oscillation conditions during oscillation startup are satisfied when the loop gain is larger than unity and the phase in the loop is 360°×n (n is an integer). The oscillation conditions during stable oscillations are satisfied when the loop gain is unity and the phase in the loop is 360°×n (n is an integer).

1.6 Power Supply Voltage of Oscillation Driver Circuit

The oscillation driver circuit 10 shown in FIG. 1 operates between the voltage VDD (high-potential power supply voltage) and the voltage AGND (reference potential). The voltage AGND is a ground potential, for example. Note that another reference potential may be used instead of the ground potential. Specifically, the power supply potential which may be used differs depending on the type of vibrator 12.

When the vibrator 12 is a capacitive-coupling transducer (configuration in which a direct-current blocking capacitor lies in the signal path in the internal equivalent circuit), direct current is cut off. Therefore, with regard to the direct current level (bias point) of the oscillation loop, it suffices that the voltage amplitude of the drive signal of the oscillation loop be adjusted regardless of the circuit operation. Therefore, an arbitrary potential may be basically used as the low-potential-side power supply, for example.

When the vibrator 12 is a variable-resistance transducer, it is necessary to set the bias voltage of the oscillation loop at a desired level. Therefore, a reference voltage at a desired level is generally used.

The power supply method is classified as a single power supply method (method using only a positive power supply) and a dual power supply method (method using positive and negative power supplies). The latter method is used particularly when accuracy is important.

Note that the invention may employ either of the above power supply methods. In FIG. 1 (and other drawings), the vibrator 12 is a capacitive-coupling transducer as is clear from the equivalent circuits shown in FIGS. 21A and 21B. The above description has been given on the assumption that a single power supply method is employed and the oscillation driver circuit 200 operates between the voltage VDD (e.g. 5 V) and the voltage GND (ground potential).

1.7 Rectangular-Wave Drive, Sine-Wave Drive, and Capacitive-Coupling vibrator

The driver device according to this embodiment shown in FIG. 1 may employ rectangular-wave drive and sine-wave drive.

Figure 21A:
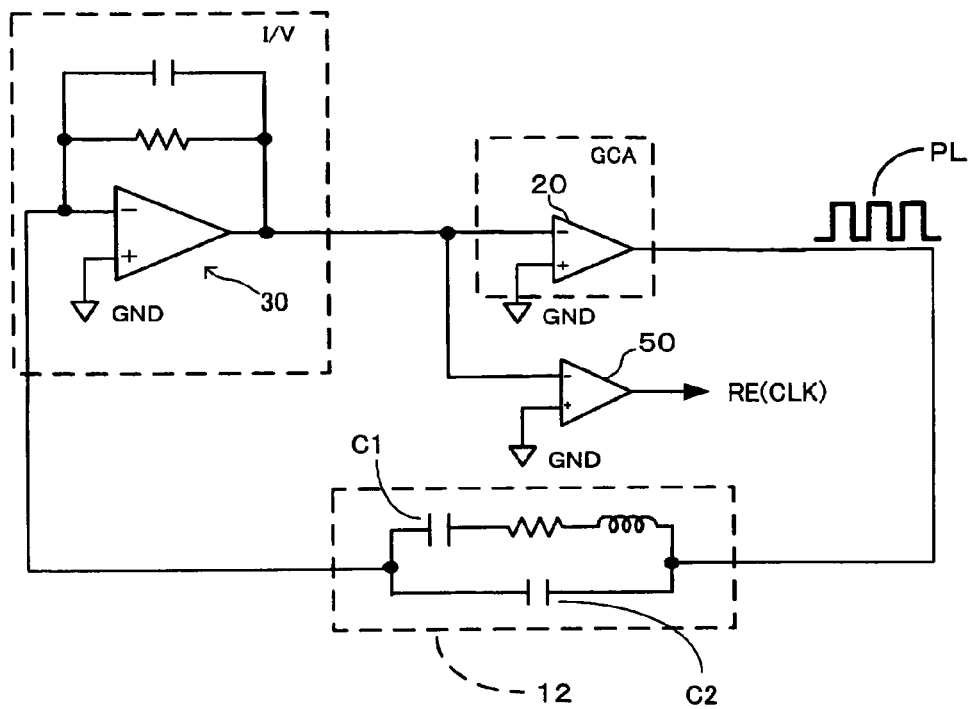
FIGS. 21A and 21B are circuit diagrams illustrative of rectangular wave drive, sine wave drive, and a capacitive-coupling vibrator.
Figure 21B:
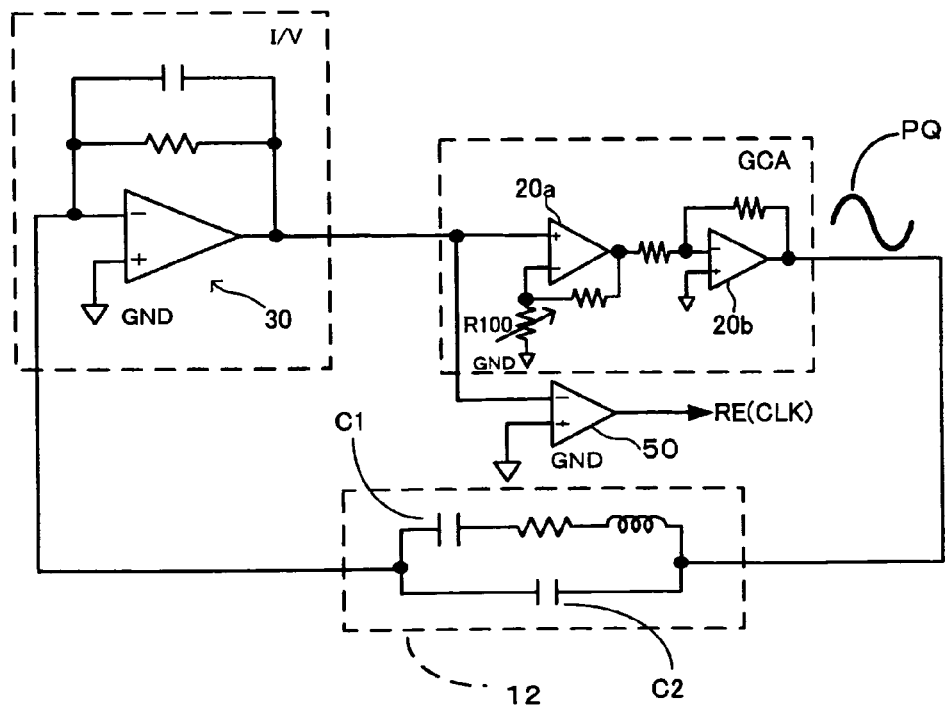

FIGS. 21A and 21B are circuit diagrams illustrative of rectangular-wave drive, sine-wave drive, and a capacitive-coupling vibrator. FIG. 21A shows the major portion of the driver device which performs rectangular wave drive. As shown in FIG. 21A, the vibrator 12 is driven by a rectangular-wave drive signal (PL). The gain of the oscillation loop can be easily controlled by adjusting the high-level voltage or the low-level voltage of the drive signal (PL).

The rectangular-wave drive method has an advantage in that the variation in the drive signal (PL) is small. Moreover, since the voltage amplitude of the drive signal is easily controlled, the circuit configuration can be simplified, whereby the circuit scale can be reduced.

FIG. 21B shows the main portion of the driver device which performs sine-wave drive. As shown in FIG. 21B, the vibrator 12 is driven by a sine-wave drive signal (PQ). The gain of the oscillation loop can be adjusted by variably controlling the resistance of a variable resistor R100 of a preceding-stage amplifier 20a included in the gain control amplifier (GCA).

In FIGS. 21A and 21B, a capacitive-coupling vibrator is used as the vibrator 12. Note that the vibrator 12 is not limited thereto. Various vibrators such as a variable-resistance vibrator may also be used.

The capacitive-coupling vibrator (capacitive vibrator) is a vibrator in which a direct-current blocking capacitor (C1 and C2 in FIG. 21) lies in the signal path in the internal equivalent circuit. A piezoelectric element can be given as an example of the capacitive-coupling vibrator (capacitive vibrator).

When using a capacitive-coupling vibrator, an arbitrary potential may be used as the direct-current potential of the oscillation loop. Therefore, the degree of freedom relating to the circuit configuration is increased.

Type of Vibrator

In this embodiment, a capacitive-coupling vibrator is used as the vibrator 12, as described above. Note that the vibrator 12 is not limited thereto. Various vibrators such as a variable-resistance vibrator may also be used.

The capacitive-coupling vibrator (capacitive vibrator) is a vibrator in which a direct-current blocking capacitor lies in the signal path in the internal equivalent circuit, as shown in FIGS. 21A and 21B. A piezoelectric element can be given as an example of the capacitive-coupling vibrator (capacitive vibrator).

When using a capacitive-coupling vibrator, an arbitrary potential may be used as the direct-current potential of the oscillation loop. Therefore, a circuit can be formed without taking the direct-current potential into account, whereby the degree of freedom of the circuit configuration is increased.

Second Embodiment

This embodiment illustrates a gyrosensor which includes the driver device according to the invention and a vibrator driven by the driver device.

2. Vibrating Gyrosensor

Figure 19:
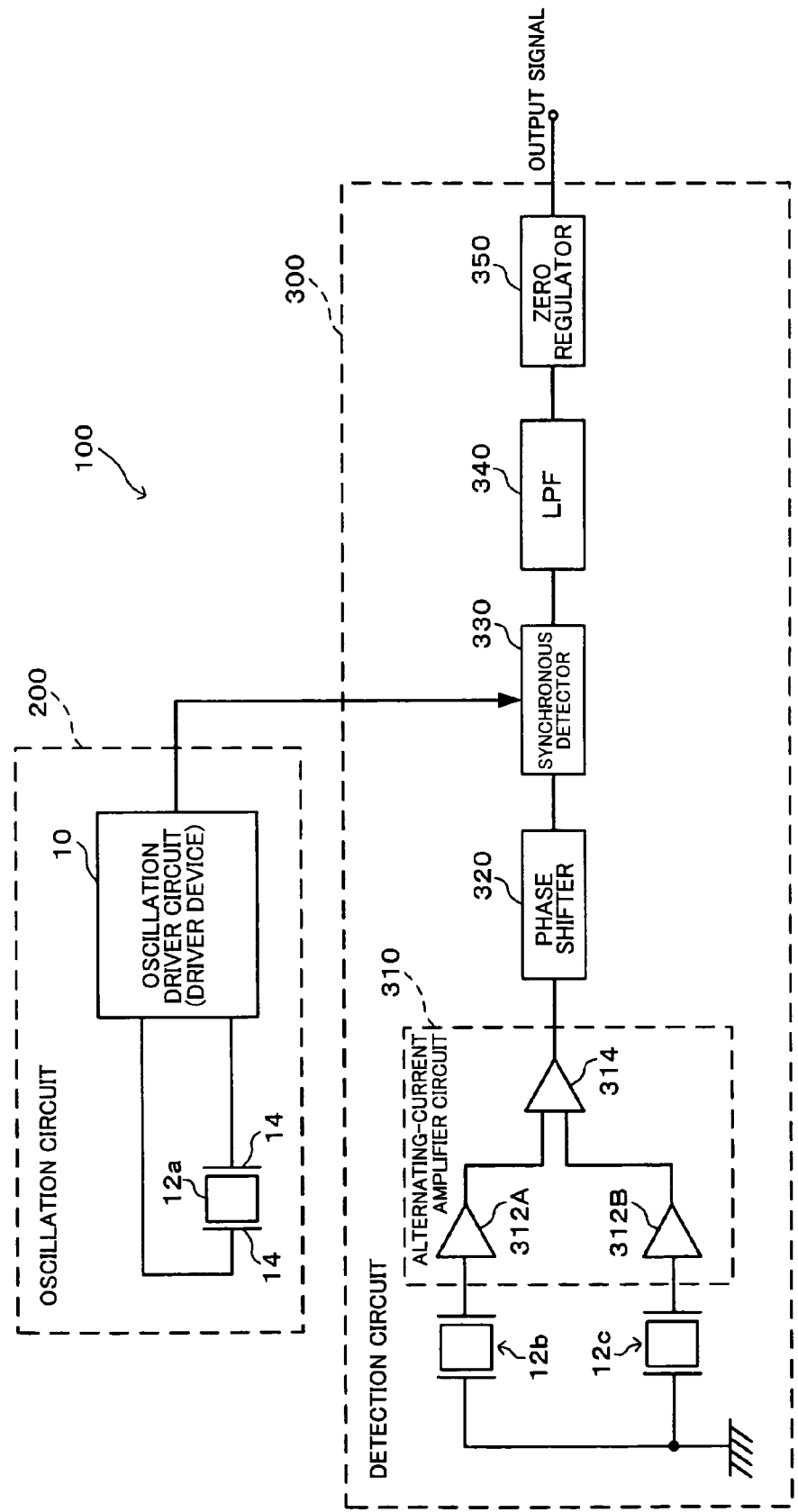
FIG. 19 is a block diagram showing a configuration example of a vibrating gyrosensor according to one embodiment of the invention.

FIG. 19 is a block diagram showing a configuration example of a vibrating gyrosensor to which the oscillation driver circuit according to this embodiment or its modification is applied.

In FIG. 19, the same sections as in FIG. 1 are indicated by the same symbols. Description of these sections is appropriately omitted.

A vibrating gyrosensor (physical quantity measuring device in a broad sense) 100 includes an oscillation circuit 200 and a detection circuit (detection device in a broad sense) 300. The oscillation circuit 200 includes the vibrator 12 and the oscillation driver circuit 10. The oscillation driver circuit 10 causes a driving vibration section 12a of the vibrator 12 to oscillate.

During oscillation startup in the normal mode, the output from the comparator 50 is input to the oscillation driver circuit 10 as noise. The noise is subjected to frequency selection while passing through the driving vibration section 12a of the vibrator 12. The signal which has passed through the driving vibration section 12a is partially removed, is input to the full-wave rectifier 42, and is converted into an amplitude. The signal having this amplitude is input to the oscillation detector 44 to generate the switch control signal SWCTL#. The amplitude of the signal subjected to frequency selection while passing through the vibrator 12a is small during oscillation startup. The oscillation detector 44 outputs the switch control signal SWCTL# shown in FIG. 3A.

The amplitude of the signal subjected to frequency selection while passing through the vibrator 12a increases immediately after oscillation startup in the normal mode, whereby the switch control signal SWCTL is set at the H level. This causes the oscillation loop to be switched so that the amplitude of the signal subjected to frequency selection while passing through the vibrator 12a is controlled by the GCA 20. When most of the noise is cut off by the driving vibration section 12a and the output from the full-wave rectifier 42 is relatively small, the gain of the GCA 20 is increased so that the loop gain of the oscillation loop becomes unity. Since the output from the full-wave rectifier 42 increases with the passage of time, the gain of the GCA 20 is reduced so that the loop gain becomes unity.

The vibrating gyrosensor is controlled in the sleep mode in the same manner as in the oscillation startup state in the normal mode.

When the oscillation state of the driving signal has been stabilized, detection of signals from driving detection sections 12b and 12c of the vibrator 12 starts. Specifically, the detection signals (alternating-current) from the driving detection sections 12b and 12c of the vibrator are amplified using alternating-current amplifiers 312A and 312B of an alternating-current amplifier circuit 310, and the outputs from the amplifiers 312A and 312B are summed using an adder 314.

The output from the adder 314 is caused to pass through a phase shifter 320 to obtain a phase-shifted signal. The phase of the phase-shifted signal differs from the phase of the synchronous detection clock signal which is the output from the comparator 50 of the oscillation driver circuit 10 by a given angle (e.g., 90 degrees). The phase-shifted signal and the synchronous detection clock signal from the oscillation driver circuit 10 are input to a synchronous detector 330 to detect the output signal from the vibrator 12. As a result, unnecessary leakage signals are removed from the detected output signal or at least reduced. Since the phase can be adjusted according to a change in phase during the weak signal detection process by adjusting the phases of the synchronous detection clock signal and the detection signal using the detection circuit 300, a highly accurate phase adjustment can be achieved while preventing an increase in circuit scale.

The detected output signal is input to a low-pass filter 340, smoothed, and input to a zero regulator 350. The output from the zero regulator 350 is removed as an output signal corresponding to the physical quantity (e.g. angular velocity) to be measured.

The vibrating gyrosensor 100 shown in FIG. 19 is preferably provided in electronic instruments such as a video camera, a digital camera, a car navigation system, an aircraft, and a robot.

The invention is not limited to the vibrator 12 illustrated in this embodiment. As examples of the material for the vibrator 12, constant modulus alloys such as elinvar and ferroelectric single crystals (piezoelectric single crystals) can be given. As examples of such single crystals, a rock crystal, lithium niobate, lithium tantalate, a lithium niobate-lithium tantalate solid solution, lithium borate, and langasite can be given. It is preferable that the vibrator 12 be hermetically sealed in a package. It is preferable that the package be filled with dry nitrogen or be under vacuum.

The physical quantity measured according to the invention is not limited to an angular velocity illustrated in this embodiment. The invention aims at a physical quantity which can be detected from a change in vibration state using a detection circuit when the vibrator is caused to produce driving vibrations and the vibration state of the vibrator has changed due to the effects of the physical quantity on the vibrator which is producing driving vibrations. As such a physical quantity, acceleration and angular acceleration are particularly preferred in addition to the angular velocity applied to the vibrator. As the detection device, an inertial sensor is preferred.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention.

What is claimed is:

1. A driver device that forms an oscillation loop with a vibrator and causes the vibrator to produce driving vibrations, the driver device comprising:
    a current-voltage converter that converts a current that flows through the vibrator into a voltage;
    an output circuit that causes the vibrator to produce the driving vibrations; and
    a high-pass filter that is provided in the oscillation loop between the current-voltage converter and the output circuit,
    the driver device causing the vibrator to produce the driving vibrations while changing a reference potential of the high-pass filter, and then causing the vibrator to produce the driving vibrations while fixing the reference potential.

2. The driver device as defined in claim 1,
    the output circuit being a comparator that causes the vibrator to produce the driving vibrations based on a signal that is converted into a voltage with respect to a given voltage.

3. The driver device as defined in claim 1,
    the output circuit being a gain control amplifier that causes the vibrator to produce the driving vibrations while controlling an oscillation amplitude in the oscillation loop.

4. The driver device as defined in claim 3,
    the driver device including a comparator that generates a synchronous detection reference signal based on a signal in the oscillation loop,
    the driver device causing the vibrator to produce the driving vibrations in the oscillation loop including the current-voltage converter, the high-pass filter, the comparator, and the vibrator during oscillation startup when the reference potential of the high-pass filter is changed; and
    the driver device causing the vibrator to produce the driving vibrations in the oscillation loop including the current-voltage converter, the high-pass filter, the gain control amplifier, and the vibrator in a steady oscillation state.

5. The driver device as defined in claim 4,
when the driver device is set in a first operation mode to perform a normal operation, the driver device causing the vibrator to produce the driving vibrations while changing the reference potential, and then causing the vibrator to produce the driving vibrations while fixing the reference potential; and
when the driver device is set in a second operation mode to perform a sleep operation, the driver device causing the vibrator to produce the driving vibrations in the oscillation loop including the current-voltage converter, the high-pass filter, the comparator, and the vibrator.

6. The driver device as defined in claim 5,
the driver device including a gain control circuit that controls a gain of the gain control amplifier based on a current that flows through the vibrator in the oscillation loop,
when the driver device is set in the second operation mode, the driver device disabling the operations of the gain control amplifier and the gain control circuit without disabling the operation of the comparator.

7. The driver device as defined in claim 3,
the driver device changing the reference potential of the high-pass filter only in a given period that starts based on a switch timing from the second operation mode to the first operation mode.

8. The driver device as defined in claim 3,
the polarity of an output from the gain control amplifier with respect to a given potential being the same as the polarity of an output from the comparator with respect to the given potential.

9. The driver device as defined in claim 1,
the driver device including:
a reference potential change circuit that supplies one voltage level selected from a plurality of voltage levels to the high-pass filter as the reference potential; and
a pulse generation circuit that generates a switch pulse that is used to select the voltage level output as the reference potential,
the pulse generation circuit outputting the switch pulse only in a given period.

10. The driver device as defined in claim 9, a start timing of the given period being a power-on reset start timing of the driver device.

11. The driver device as defined in claim 9, a finish timing of the given period being a timing when it has been detected that a signal in the oscillation loop has exceeded a given threshold value level or a timing when a given number has been counted based on a start timing of the given period.

12. The driver device as defined in claim 9, the pulse generation circuit including:
a power-on reset circuit that generates a power-on reset signal; and
a switch pulse generation circuit that generates one or more pulses in a given period based on the power-on reset signal;
the switch pulse generation circuit including a plurality of delay units, each of the plurality of delay units generating a pulse based on an input signal, the switch pulse generation circuit outputting a logical OR result of the pulses generated by the plurality of delay units; and
the pulse generation circuit outputting the switch pulse in a period from a change timing of the power-on reset signal to a change timing of a detection result signal that indicates that a signal in the oscillation loop has exceeded a given threshold value level.

13. The driver device as defined in claim 1,
an amplitude of a change in the reference potential in a reference potential change period being greater than an amplitude of an input offset voltage of the output circuit.

14. The driver device as defined in claim 1,
the high-pass filter including:
a capacitor element that is inserted between an output of the current-voltage converter and an input of the output circuit; and
a resistor element, the reference potential being supplied to one end of the resistor element, and the input of the output circuit being connected to the other end of the resistor element.

15. The driver device as defined in claim 14,
when the capacitance of the capacitor element is referred to as C, the resistance of the resistor element is referred to as R, and the amplitude of a change in the reference potential is referred to as $\Delta V$, an input offset voltage Vx of the output circuit being smaller than $\Delta V/((1+(\omega \times C \times R)^2)^{1/2}$.

16. The driver device as defined in claim 13,
when the reference potential in a steady oscillation state is referred to as V0, the reference potential being a potential that is alternately switched between a voltage V4 that is higher in potential than the voltage V0 and a voltage V3 that is lower in potential than the voltage V0 in a reference potential change period.

17. The driver device as defined in claim 13,
when the reference potential in a steady oscillation state is referred to as V0, the reference potential being a potential that is alternately switched between the voltage V0 and a voltage V4 that is higher in potential than the voltage V0.

18. The driver device as defined in claim 13,
when the reference potential in a steady oscillation state is referred to as V0, the reference potential being a potential that is alternately switched between the voltage V0 and a voltage V3 that is lower in potential than the voltage V0.

19. The driver device as defined in claim 1,
the vibrator being a capacitive-coupling vibrator; and
the output circuit causing the vibrator to produce the driving vibrations by applying a rectangular-wave drive signal to the vibrator.

20. A physical quantity measuring device that measures a physical quantity corresponding to a detection signal output from a vibrator based on driving vibrations produced by the vibrator and the physical quantity to be measured, the physical quantity measuring device comprising:
the vibrator;
the driver device as defined in claim 1 that causes the vibrator to produce the driving vibrations; and
a detection device that detects an output signal corresponding to the physical quantity based on the detection signal,
the detection device including a synchronous detector that synchronously detects the detection signal based on an output from a comparator, the comparator generating a synchronous detection reference signal based on a signal in the oscillation loop.

21. The physical quantity measuring device as defined in claim 20,
the detection device including a phase shifter that adjusts phases of an output from the comparator and the detection signal.

22. An electronic instrument comprising the physical quantity measuring device as defined in claim 20.

* * * * *